(12) United States Patent
Kim et al.

(10) Patent No.: US 12,219,823 B2
(45) Date of Patent: Feb. 4, 2025

(54) DISPLAY DEVICE

(71) Applicant: Samsung Display Co., LTD., Yongin-si (KR)

(72) Inventors: Seul Ki Kim, Gwangmyeong-si (KR); Seon Beom Ji, Seoul (KR); Tae Ha Jin, Yongin-si (KR); Dong Hwan Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 527 days.

(21) Appl. No.: 17/526,334

(22) Filed: Nov. 15, 2021

(65) Prior Publication Data

US 2022/0302235 A1    Sep. 22, 2022

(30) Foreign Application Priority Data

Mar. 18, 2021   (KR) .......................... 10-2021-0035139

(51) Int. Cl.
*H10K 59/124*       (2023.01)
*H10K 59/131*       (2023.01)

(52) U.S. Cl.
CPC ......... *H10K 59/124* (2023.02); *H10K 59/131* (2023.02)

(58) Field of Classification Search
CPC .. H10K 59/124; H10K 59/131; H10K 59/123; H10K 59/1275; H10K 59/805; H01L 33/20; H01L 33/62; H01L 33/44; H01L 27/124; H01L 27/156;

(Continued)

(56) References Cited

U.S. PATENT DOCUMENTS

| 2016/0233286 A1 | 8/2016 | Kim et al. |
| 2020/0168585 A1 | 5/2020 | Lo et al. |
| 2020/0211473 A1* | 7/2020 | Kim ...................... H10K 59/32 |

(Continued)

FOREIGN PATENT DOCUMENTS

| KR | 98-10549 | 4/1998 |
| KR | 10-2020-0085977 | 7/2020 |

(Continued)

OTHER PUBLICATIONS

Extended European Search Report, corresponding to European Application No./Patent No. 22156442.0, dated Aug. 1, 2022.

*Primary Examiner* — Evren Seven
*Assistant Examiner* — Sarah L Ell
(74) *Attorney, Agent, or Firm* — KILE PARK REED & HOUTTEMAN PLLC

(57) ABSTRACT

A display device includes electrodes disposed on a substrate, the electrodes extending in a first direction and being spaced apart from each other, a first insulating layer disposed on the electrodes, light-emitting elements disposed on the first insulating layer, between the electrodes, a second insulating layer disposed on the light-emitting elements, the second insulating layer extending in the first direction, connecting electrodes disposed on the second insulating layer and the light-emitting elements, the connecting electrodes electrically contacting end portions of each of the light-emitting elements, and a third insulating layer disposed between the connecting electrodes. An end portion of at least one of the connecting electrodes overlaps another one of the connecting electrodes.

20 Claims, 22 Drawing Sheets

(58) Field of Classification Search
CPC ............... H01L 27/1248; H01L 25/167; H01L 25/0753; G09G 2300/0421–0434; H05B 33/0896
See application file for complete search history.

(56) References Cited

U.S. PATENT DOCUMENTS

| | | | |
|---|---|---|---|
| 2020/0273906 A1* | 8/2020 | Li | ............................ H01L 33/38 |
| 2021/0249392 A1* | 8/2021 | Woo | ........................ H01L 33/62 |
| 2022/0052033 A1* | 2/2022 | Lee | ......................... H01L 33/62 |
| 2022/0052106 A1* | 2/2022 | Lee | ......................... H01L 33/18 |
| 2022/0149079 A1 | 5/2022 | Kang et al. | |
| 2022/0208925 A1* | 6/2022 | Park | ...................... G09G 3/3291 |
| 2023/0209864 A1* | 6/2023 | Kim | ..................... H10K 50/822 257/40 |

FOREIGN PATENT DOCUMENTS

| | | | | |
|---|---|---|---|---|
| KR | 1020220096042 | * | 7/2022 | ......... H01L 27/3276 |
| WO | 2020/0166774 | | 8/2020 | |

* cited by examiner

DISPLAY DEVICE

CROSS-REFERENCE TO RELATED APPLICATION(S)

This application claims priority to and the benefit of Korean Patent Application No. 10-2021-0035139 under 35 U.S.C. § 119, filed in the Korean Intellectual Property Office (KIPO) on Mar. 18, 2021, the entire contents of which are incorporated herein by reference.

BACKGROUND

1. Technical Field

The disclosure relates to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

Typically, a display device, which displays an image, may include a display panel such as an OLED display panel or an LCD panel. The display panel, particularly, a light-emitting element display panel, may include light-emitting elements. For example, light-emitting diodes (LEDs) may include OLEDs using an organic material as a light-emitting material and inorganic light-emitting diodes (ILEDs) using an inorganic material as a light-emitting material.

SUMMARY

Embodiments of the disclosure provide a display device capable of repairing dark-spot defects that may be caused by disconnected connecting electrodes.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, the display device may comprise electrodes disposed on a substrate, the electrodes extending in a first direction and spaced apart from each other, a first insulating layer disposed on the electrodes, light-emitting elements disposed on the first insulating layer, between the electrodes, a second insulating layer disposed on the light-emitting elements, the second insulating layer extending in the first direction, connecting electrodes disposed on the second insulating layer and the light-emitting elements, the connecting electrodes electrically contacting end portions of each of the light-emitting elements, and a third insulating layer disposed between the connecting electrodes. An end portion of at least one of the connecting electrodes overlaps with another one of the connecting electrodes.

In an embodiment, the electrodes may include a first electrode, a second electrode, a third electrode that is disposed between a side of the first electrode and a side of the second electrode, and a fourth electrode that faces the other side of the second electrode.

In an embodiment, the connecting electrodes may include a first connecting electrode that overlaps the first electrode, a second connecting electrode that overlaps the second electrode, a third connecting electrode that extends to overlap the third electrode and is bent in part to overlap the first electrode, a fourth connecting electrode that extends to overlap the fourth electrode and is bent in part to overlap the second electrode, and a fifth connecting electrode that extends to overlap the third electrode and is bent in part to overlap the fourth electrode.

In an embodiment, the third connecting electrode may include a first extension that overlaps the third electrode, a second extension that overlaps the first electrode, and a first connector that electrically connects the first and second extensions, the fourth connecting electrode may include a third extension that overlaps the fourth electrode, a fourth extension that overlaps the second electrode, and a second connector that electrically connects the third and fourth extensions, and the fifth connecting electrode may include a fifth extension that overlaps the third electrode, a sixth extension that overlaps the fourth electrode, and a third connector that electrically connects the fifth and sixth extensions.

In an embodiment, the first connecting electrode may include a first part that is disposed at an end of the first connecting electrode and has a width larger than widths of other parts of the first connecting electrode in a second direction intersecting the first direction, and the first part may overlap the second extension of the third connecting electrode.

In an embodiment, the second connecting electrode may include a second part that is disposed at an end of the second connecting electrode and has a width larger than widths of other part of the second connecting electrode in a second direction intersecting the first direction, and the second part may overlap the fourth extension of the fourth connecting electrode.

In an embodiment, the fifth connecting electrode may include a third part that is disposed at an end of the fifth extension and has a width larger than other parts of the fifth extension in a second direction intersecting the first direction, and a fourth part that is disposed at an end of the sixth extension and has a width larger than other parts of the sixth extension in the second direction, the third part may overlap the first extension of the third connecting electrode, and the fourth part may overlap the third extension of the fourth connecting electrode.

In an embodiment, the display device may further comprise a through hole penetrating the first part and the third insulating layer to expose the second extension of the third connecting electrode, and a conductive member electrically contacting the first part, the third insulating layer, and the second extension of the third connecting electrode.

In an embodiment, the light-emitting elements may include a first light-emitting element that is disposed between the first connecting electrode and the first extension of the third connecting electrode, a second light-emitting element that is disposed between the second connecting electrode and the third extension of the fourth connecting electrode, a third light-emitting element that is disposed between the second extension of the third connecting electrode and the fifth extension of the fifth connecting electrode, and a fourth light-emitting element that is disposed between the fourth extension of the fourth connecting electrode and the sixth extension of the fifth connecting electrode.

According to an embodiment of the disclosure, the display device may comprise electrodes disposed on a substrate, the electrodes extending in a first direction and spaced apart from each other, a first insulating layer disposed on the electrodes, light-emitting elements disposed on the first insulating layer between the electrodes, a second insulating layer disposed on the light-emitting elements, the second insulating layer extending in the first direction, connecting electrodes disposed on the second insulating layer and the light-emitting elements, the connecting electrodes electrically contacting end portions of each of the light-emitting elements, a third insulating layer disposed between the connecting electrodes, a through hole penetrating one of the connecting electrodes and the third insulating layer, and a conductive member disposed to fill the through hole. An end portion of at least one of the connecting electrodes may overlap another one of the connecting electrodes, the through hole may penetrate the end portion of the at least one of the connecting electrodes to expose the connecting electrode overlapping the end portion of the at least one of the connecting electrodes, and the conductive member electrically contacting the end portion of the at least one of the connecting electrodes, the third insulating layer, and the connecting electrode overlapping the end portion of the at least one of the connecting electrodes, through the through hole.

In an embodiment, the electrodes may include a first electrode, a second electrode, a third electrode that is disposed between a side of the first electrode and a side of the second electrode, and a fourth electrode that faces another side of the second electrode, and the connecting electrodes may include a first connecting electrode that overlaps the first electrode, a second connecting electrode that overlaps the second electrode, a third connecting electrode that extends to overlap the third electrode and is bent in part to overlap the first electrode, a fourth connecting electrode that extends to overlap the fourth electrode and is bent in part to overlap the second electrode, and a fifth connecting electrode that extends to overlap the third electrode and is bent in part to overlap the fourth electrode.

In an embodiment, the third connecting electrode may include a first extension that overlaps the third electrode, a second extension that overlaps the first electrode, and a first connector that electrically connects the first and second extensions, the fourth connecting electrode may include a third extension that overlaps the fourth electrode, a fourth extension that overlaps the second electrode, and a second connector that electrically connects the third and fourth extensions, and the fifth connecting electrode may include a fifth extension that overlaps the third electrode, a sixth extension that overlaps the fourth electrode, and a third connector that electrically connects the fifth and sixth extensions.

In an embodiment, the first connecting electrode may include a first part that is disposed at an end of the first connecting electrode and has a width larger than widths of other parts of the first connecting electrode in a second direction intersecting the first direction, and the first part may overlap the second extension of the third connecting electrode.

In an embodiment, the second connecting electrode may include a second part that is disposed at an end of the second connecting electrode and has a width larger than widths of other parts of the second connecting electrode in a second direction intersecting the first direction, the second part may overlap the fourth extension of the fourth connecting electrode, the fifth connecting electrode may include a third part that is disposed at an end of the fifth extension and has a width larger than widths of other parts of the fifth extension in the second direction, and a fourth part that is disposed at an end of the sixth extension and has a width larger than widths of other parts of the sixth extension in the second direction, the third part may overlap the first extension of the third connecting electrode, and the fourth part may overlap the third extension of the fourth connecting electrode.

In an embodiment, the through hole may penetrate the first part and the third insulating layer to expose the second extension of the third connecting electrode, and the conductive member may electrically contact the first part, the third insulating layer, and the second extension of the third connecting electrode.

According to an embodiment of the disclosure, the display device may comprise electrodes disposed on a substrate, the electrodes extending in a first direction and spaced apart from each other, a first insulating layer disposed on the electrodes, light-emitting elements disposed on the first insulating layer, between the electrodes, a second insulating layer disposed on the light-emitting elements, the second insulating layer extending in the first direction, connecting electrodes disposed on the second insulating layer and the light-emitting elements, the connecting electrodes electrically contacting end portions of each of the light-emitting elements, and a third insulating layer disposed between the connecting electrodes. Each of at least two of the connecting electrodes may include a protrusion that protrudes in a second direction intersecting the first direction, and one of protrusions of the at least two of the connecting electrodes overlaps another one of the protrusions of the at least two of the connecting electrodes.

In an embodiment, the electrodes may include a first electrode, a second electrode, a third electrode that is disposed between a side of the first electrode and a side of the second electrode, and a fourth electrode that faces the other side of the second electrode, and the connecting electrodes may include a first connecting electrode that overlaps the first electrode, a second connecting electrode that overlaps the second electrode, a third connecting electrode that extends to overlap the third electrode and is bent in part to overlap the first electrode, a fourth connecting electrode that extends to overlap the fourth electrode and is bent in part to overlap the second electrode, and a fifth connecting electrode that extends to overlap the third electrode and is bent in part to overlap the fourth electrode.

In an embodiment, the third connecting electrode may include a first extension that overlaps the third electrode, a second extension that overlaps with the first electrode, and a first connector that electrically connects the first and second extensions, the fourth connecting electrode may include a third extension that overlaps the fourth electrode, a fourth extension that overlaps the second electrode, and a second connector that electrically connects the third and fourth extensions, and the fifth connecting electrode may include a fifth extension that overlaps the third electrode, a sixth extension that overlaps with the fourth electrode, and a third connector that electrically connects the fifth and sixth extensions.

In an embodiment, the first connecting electrode may include a first protrusion that protrudes from an end of the first connecting electrode in the second direction, the third connecting electrode may include a second protrusion that protrudes from the first connector in the second direction, and the first and second protrusions may overlap each other.

In an embodiment, the display device may further comprise a through hole penetrating the first protrusion and the third insulating layer to expose the second protrusion, and a conductive member electrically contacting the first protrusion, the third insulating layer, and the second protrusion through the through hole.

According to the aforementioned and other embodiments of the disclosure, as connecting electrodes are disposed to overlap in part each other, any disconnected connecting electrode can be repaired by forming a through hole and a conductive member in the overlapping area of the connecting electrodes.

Also, a dark-spot defect that may be caused by any disconnected connecting electrode can be repaired, and as a result, productivity can be improved.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments of the disclosure will hereinafter be described with reference to the accompanying drawings.

Figure 1:
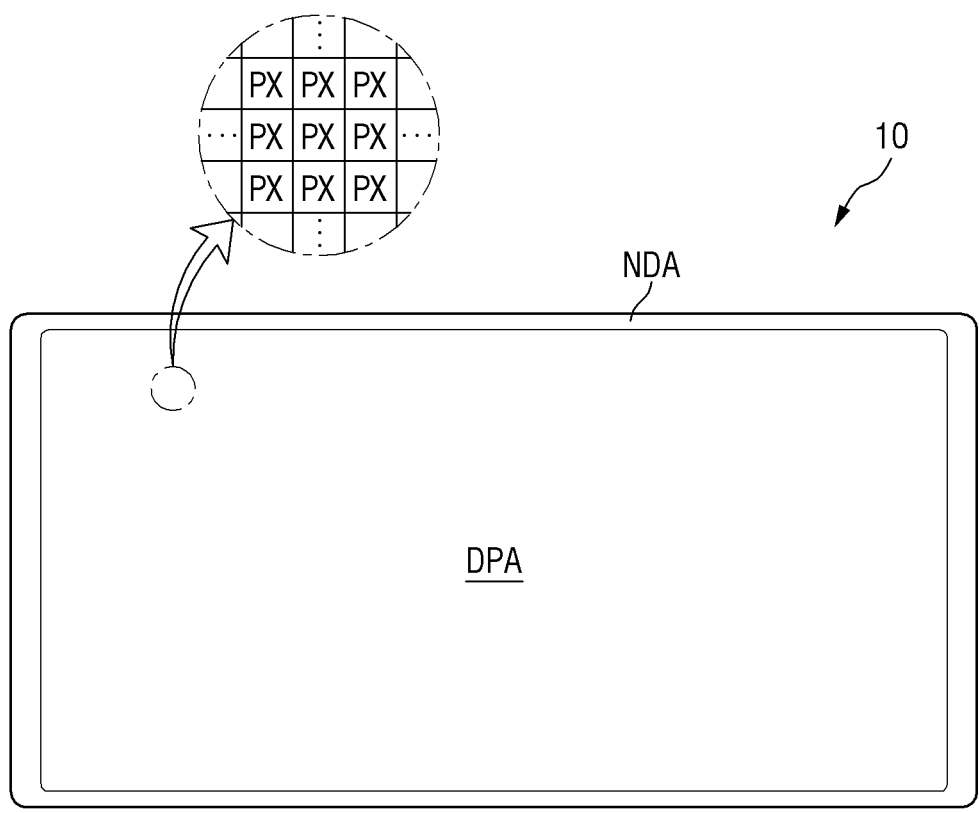
FIG. 1 is a schematic plan view of a display device according to an embodiment of the disclosure.

FIG. 1 is a schematic plan view of a display device according to an embodiment.

Referring to FIG. 1, a display device 10 displays a moving or still image. The display device 10 may refer to all types of electronic devices that provide a display screen. Examples of the display device 10 may include a television (TV), a laptop computer, a monitor, a billboard, an Internet of things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 may include a display panel that provides a display screen. Examples of the display panel include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 10 will hereinafter be described as being an ILED display panel, but the disclosure is not limited thereto.

First, second, and third directions DR1, DR2, and DR3 are as defined in the accompanying drawings. The first and second directions DR1 and DR2 may be directions that are perpendicular to each other in a single plane. The third direction DR3 may be a direction that is perpendicular to the plane defined by the first and second directions DR1 and DR2. The third direction DR3 may form a right angle with each of the first and second directions DR and DR2. The third direction DR3 may be the thickness direction of the display device 10.

The shape of the display device 10 may vary. In an embodiment, the display device 10 may have a rectangular shape that extends longer in the first direction DR1 than in the second direction DR2 in a plan view. In an embodiment, the display device 10 may have a rectangular shape that extends longer in the second direction DR2 than in the first direction DR1 in a plan view. However, the disclosure is not limited to these examples. In an embodiment, the display device 10 may have a square shape, a rectangular shape with rounded corners, another polygonal shape, or a circular shape. A display area DPA of the display device 10 may have a similar shape to the display device 10. FIG. 1 illustrates that the display device 10 and the display area DPA have a rectangular shape that extends longer in the first direction DR1 than in the second direction DR2.

The display device 10 may include the display area DPA and a non-display area NDA. The display area DPA is an area in which an image is displayed, and the non-display area NDA is an area in which an image is not displayed. The display area DPA may also be referred to as an active area, and the non-display area NDA may also be referred to as an inactive area. The display area DPA may generally account for a middle portion of the display device 10.

The display area DPA may include pixels PX. The pixels PX may be arranged in row and column directions. The pixels PX may have a rectangular or square shape in a plan view, but the disclosure is not limited thereto. As another example, the pixels PX may have a rhombic shape that is inclined with respect to a direction. The pixels PX may be alternately arranged in a stripe fashion or a PENTILE™ fashion. Each of the pixels PX may include one or more light-emitting elements that emit light of a particular wavelength range to emit light of a predetermined color.

The non-display area NDA may be disposed on the periphery of the display area DPA. The non-display area NDA may surround the entire display area DPA or portion of the display area DPA. The display area DPA may have a rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
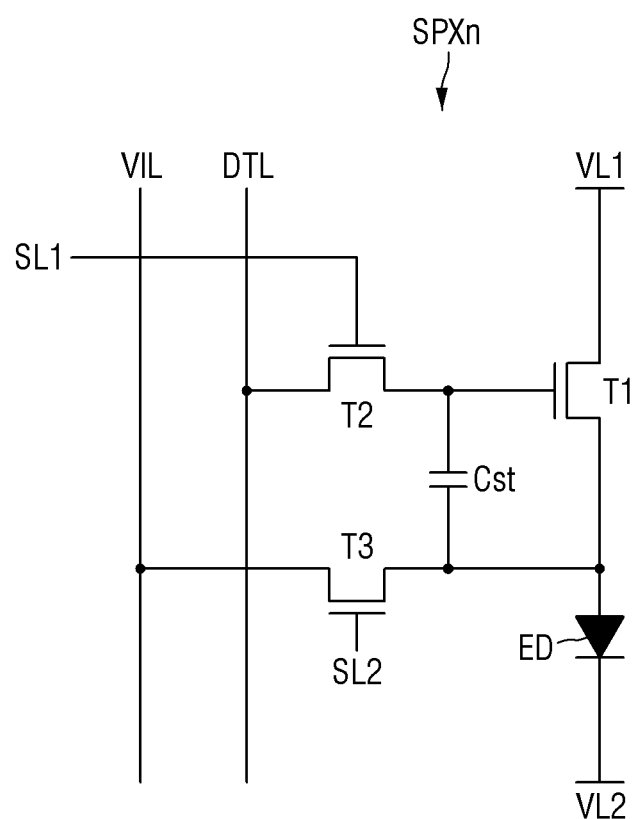
FIG. 2 is an equivalent circuit diagram of a subpixel of the display device of FIG. 1.

FIG. 2 is a schematic diagram of an equivalent circuit of a subpixel of the display device of FIG. 1.

Referring to FIG. 2, a subpixel SPXn of the display device 10 may include a light-emitting element ED, three transistors, for example, first, second, and third transistors T1, T2, and T3, and a storage capacitor Cst.

The light-emitting element ED may emit light in accordance with a current applied thereto via the first transistor T1. The light-emitting element ED may emit light of a particular wavelength range in accordance with electrical signals transmitted thereto from first and second electrodes, which are connected to both ends of the light-emitting element ED.

A first end of the light-emitting element ED may be connected to a source electrode of the first transistor T1, and a second end of the light-emitting element ED may be electrically connected to a second voltage line VL2, to which a low-potential voltage (hereinafter a second power supply voltage) lower than a high-potential voltage (hereinafter a first power supply voltage) is supplied.

The first transistor T1 controls a current flowing from a first voltage line VL1, to which the first power supply voltage is supplied, to the light-emitting element ED in accordance with the difference in voltage between the gate electrode and the source electrode of the first transistor T1. In an embodiment, the first transistor T1 may be a transistor for driving the light-emitting element ED. The gate electrode of the first transistor T1 may be connected to the source electrode of the second transistor T2, the source electrode of the first transistor T1 may be connected to the first end of the light-emitting element ED, and the drain electrode of the first transistor T1 may be connected to the first voltage line VL1, to which the first power supply voltage is supplied.

The second transistor T2 is turned on by a first scan signal from a first scan line SL1 to connect a data line DTL to the gate electrode of the first transistor T1. The gate electrode of the second transistor T2 may be connected to the first scan line SL1, the source electrode of the second transistor T2 may be connected to the gate electrode of the first transistor T1, and the drain electrode of the second transistor T2 may be connected to the data line DTL.

The third transistor T3 is turned on by a scan signal from a second scan line SL2 to connect an initialization voltage line VIL to a first end of the light-emitting element ED. The gate electrode of the third transistor T3 may be connected to the second scan lien SL2, the drain electrode of the third transistor T3 may be connected to the initialization voltage line VIL, and the source electrode of the third transistor T3 may be connected to the first end of the light-emitting element ED or the source electrode of the first transistor T1. FIG. 2 illustrates that the first and second scan lines SL1 and SL2 are separate lines, but the disclosure is not limited thereto. As another example, in some embodiments, the first and second scan lines SL1 and SL2 may be formed as a single scan line, in which case, the second and third transistors T2 and T3 may be turned on by the same scan signal.

The source electrodes and the drain electrodes of the first, second, and third transistors T1, T2, and T3 are not limited to the above descriptions. The first, second, and third transistors T1, T2, and T3 may be formed as thin-film transistors (TFTs). FIG. 2 illustrates that the first, second, and third transistors T1, T2, and T3 are formed as N-type metal-oxide semiconductor field-effect transistors (MOSFETs), but the disclosure is not limited thereto. In another example, the first, second, and third transistors T1, T2, and T3 may all be formed as P-type MOSFETs. As yet another example, some of the first, second, and third transistors T1, T2, and T3 may be formed as N-type MOSFETS, and the other transistor(s) may be formed as P-type MOSFETs.

The storage capacitor Cst is formed between the gate electrode and the source electrode of the first transistor T1. The storage capacitor Cst stores a differential voltage corresponding to the difference in voltage between the gate electrode and the source electrode of the first transistor T1.

The structure of a pixel PX of the display device 10 will hereinafter be described in further detail.

Figure 3:
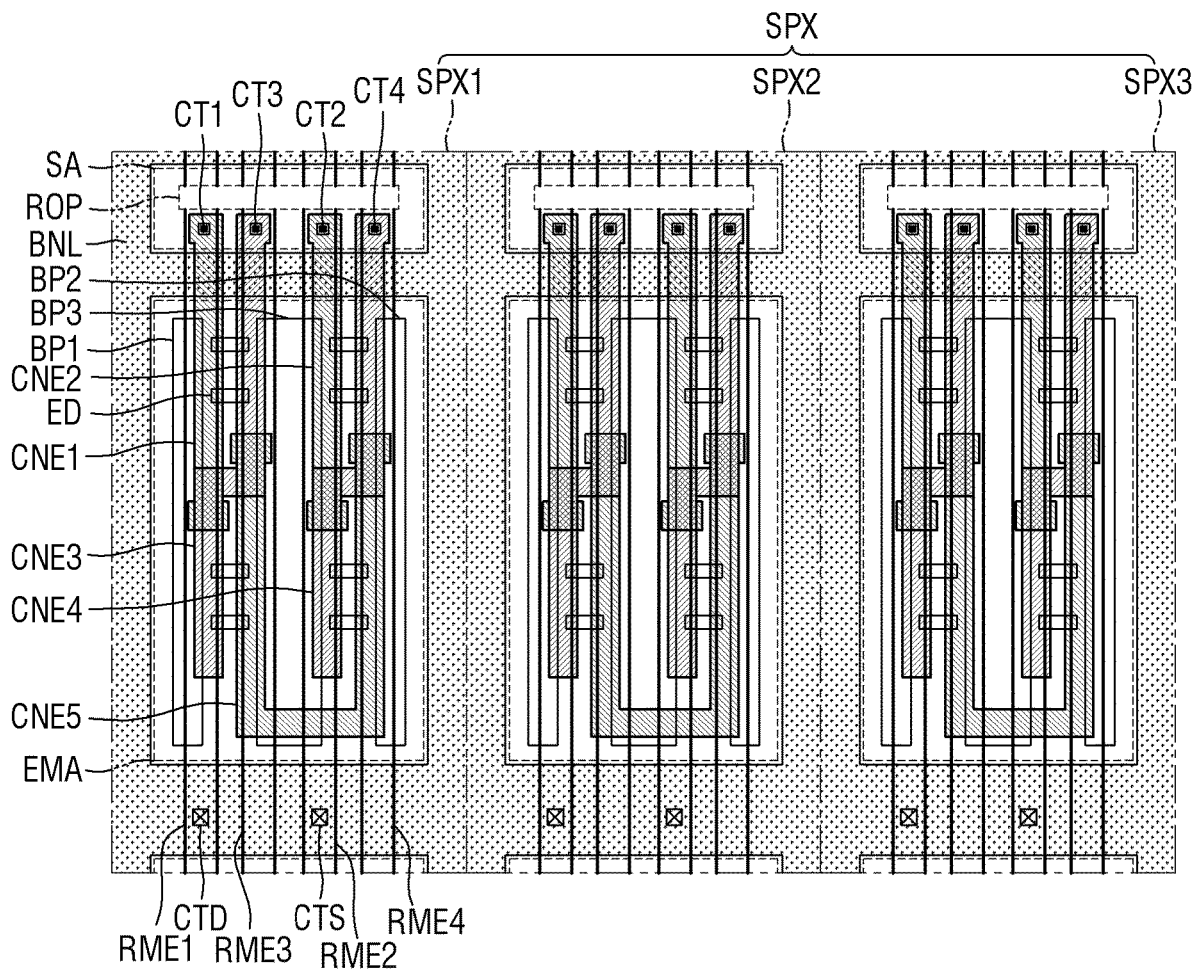
FIG. 3 is a schematic plan view of a pixel of the display device of FIG. 1.

FIG. 3 is a schematic plan view of a pixel of the display device of FIG. 1.

Referring to FIG. 3, a pixel PX may include subpixels SPXn (where n is an integer of 1 to 3). In an embodiment, the pixel PX may include first, second, and third subpixels SPX1, SPX2, and SPX3. The first subpixel SPX1 may emit first-color light, the second subpixel SPX2 may emit second-color light, and the third subpixel SPX3 may emit third-color light. In an embodiment, the first-color light, the second-color light, and the third-color light may be blue light, green light, and red light, respectively, but the disclosure is not limited thereto. As another example, the subpixels SPXn may all emit light of the same color. In an embodiment, the subpixels SPXn may emit blue light. FIG. 3 illustrates that the pixel PX may include three subpixels SPXn, but the disclosure is not limited thereto. As another example, the pixel PX may include more than three subpixels SPXn.

Each of the subpixels SPXn may include an emission area EMA and a non-emission area. The emission area EMA may be an area that outputs light of a particular wavelength range from light-emitting elements ED being disposed therein, whereas the non-emission area may be an area which has no light-emitting elements ED disposed therein, is not reached by light emitted by light-emitting elements ED, and thus does not output light. The emission area EMA may include a region where the light-emitting elements ED are disposed and a region around the light-emitting elements ED where light emitted by the light-emitting elements ED is output.

However, the disclosure is not limited thereto. The emission area EMA may include an area from which light emitted by the light-emitting elements ED is reflected or refracted by other members and output. Light-emitting elements ED may be disposed in each of the subpixels SPXn to form an emission area EMA including a region in which the light-emitting elements ED are disposed and the surroundings of the region in which the light-emitting elements ED are disposed.

FIG. 3 illustrates that the emission areas EMA of the first, second, and third subpixels SPX1, SPX2, and SPX3 have substantially the same size. In some embodiments, the emission areas EMA of the subpixels SPXn may have different sizes depending on the color or wavelength of light emitted by light-emitting elements ED.

Each of the subpixels SPXn may further include a subarea SA, which is disposed in the non-emission area of the corresponding subpixel SPXn. The subarea SA may be disposed on a first side, in the second direction DR2, of the emission area EMA of the corresponding subpixel SPXn, between the emission area EMA of the corresponding subpixel SPXn and the emission area EMA of a neighboring subpixel SPXn adjacent to the corresponding subpixel SPXn in the second direction DR2. In an embodiment, emission areas EMA may be arranged one after another in the second direction DR2, subareas SA may be arranged one after another in the second direction DR2, and the emission areas EMA and the subareas SA may be alternately arranged. However, the disclosure is not limited to this example. Emission areas EMA and subareas SA of the subpixels SPXn may also have an arrangement different from that of FIG. 3. As illustrated in FIG. 3, an emission area EMA and a subarea SA disposed on one side (or first side), in the second direction DR2, of the emission area EMA may be included in a subpixel SPXn, and a subarea SA of a neighboring subpixel SPXn may be provided on the other side (or second side), in the second direction DR2, of the emission area EMA.

A bank BNL may be disposed between the subareas SA of the subpixels SPXn, between the emission areas EMA of the subpixels SPXn, and between the subareas SA and the emission areas EMA of the subpixels SPXn. The distances between the subareas SA of the subpixels SPXn, between the emission areas EMA of the subpixels SPXn, and between the subareas SA and the emission areas EMA of the subpixels SPXn may vary depending on the width of the bank BNL. As no light-emitting elements ED are disposed in the subareas SA of the subpixels SPXn, no light may be output from the subareas SA of the subpixels SPXn, but a part of electrodes RME may be disposed in the subareas SA of the subpixels SPXn. Two groups of electrodes RME from two different subpixels SPXn may be separated from each other in a separation part ROP of a subarea SA of one of the two different subpixels SPXn.

The bank BNL may include parts that extend in the first direction DR1 and parts that extend in the second direction DR2, and may be arranged in a lattice pattern in a plan view, in the entire display area DPA. The bank BNL may be disposed along the boundaries of each of the subpixels SPXn to separate the subpixels SPXn from one another. The bank BNL may be disposed to surround each of the emission areas EMA of the subpixels SPXn to separate the emission areas EMA of the subpixels SPXn from one another.

Pixels PX or subpixels SPXn of the display device 10 may include pixel driving circuits. Lines may be provided to pass through or by the pixels PX or the subpixels SPXn of the display device 10 and apply driving signals to the pixel driving circuits. Each of the pixel driving circuits may include transistors and capacitors. The numbers of transistors and capacitors included in each of the pixel driving circuits may vary. In an embodiment, the pixel driving circuits may have a "3T1C" structure including three transistors and a capacitor, as illustrated in FIG. 2. The pixel driving circuits will hereinafter be described as having the "3T1C" structure, but the disclosure is not limited thereto. As another example, other various structures such as a "2T1C," "7T1C," or "6T1C" structure may also be applicable to the pixel driving circuits.

Figure 4:
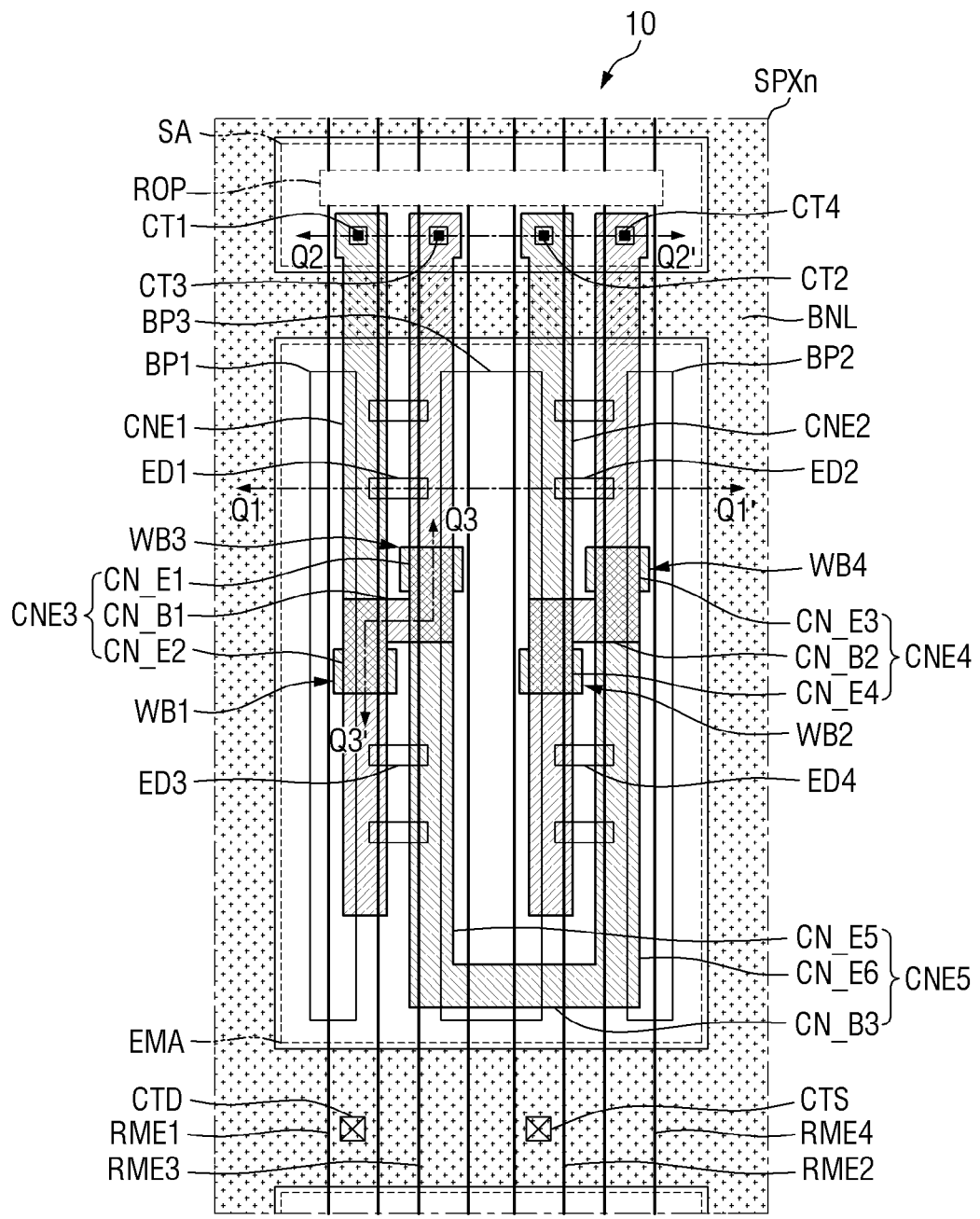
FIG. 4 is a schematic plan view of a first subpixel of FIG. 3.
Figure 5:
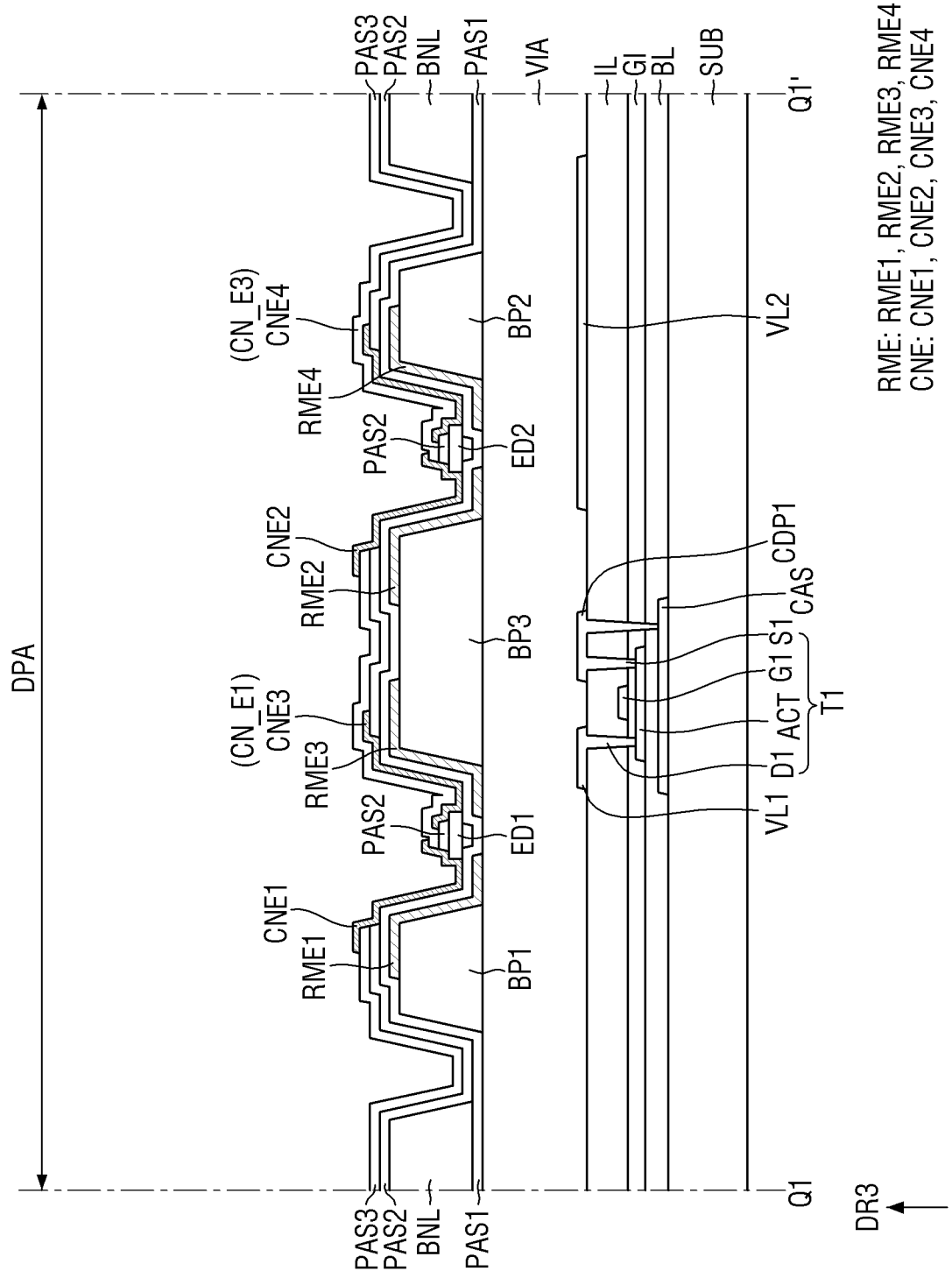
FIG. 5 is a schematic cross-sectional view taken along line Q1-Q1' of FIG. 4.
Figure 6:
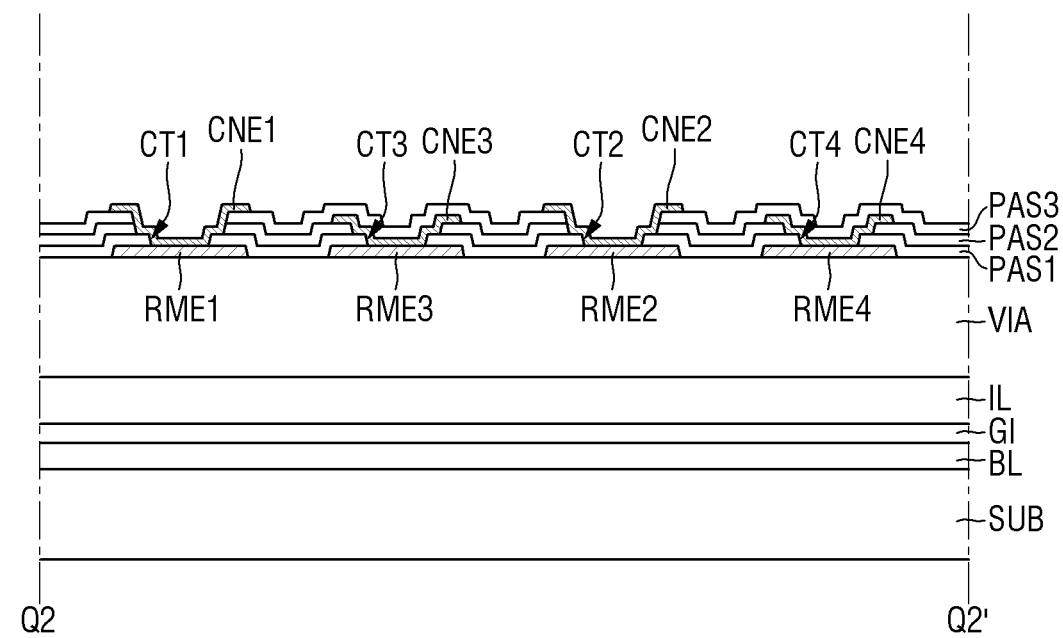
FIG. 6 is a schematic cross-sectional view taken along line Q2-Q2' of FIG. 4.
Figure 7:
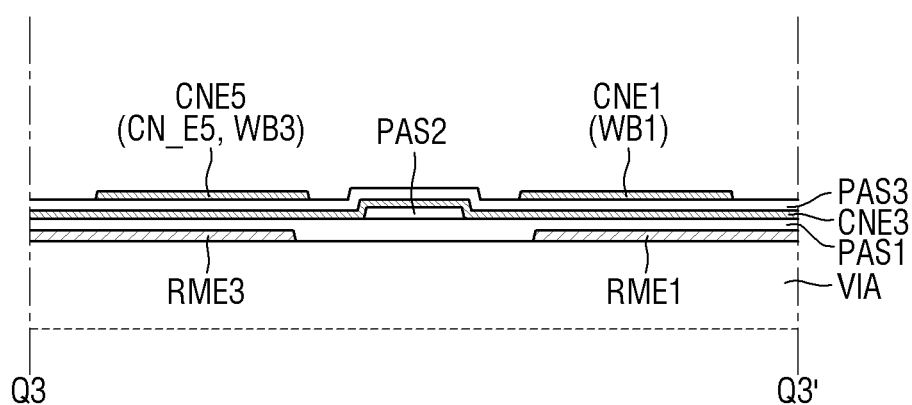
FIG. 7 is a schematic cross-sectional view taken along line Q3-Q3' of FIG. 4.
Figure 8:
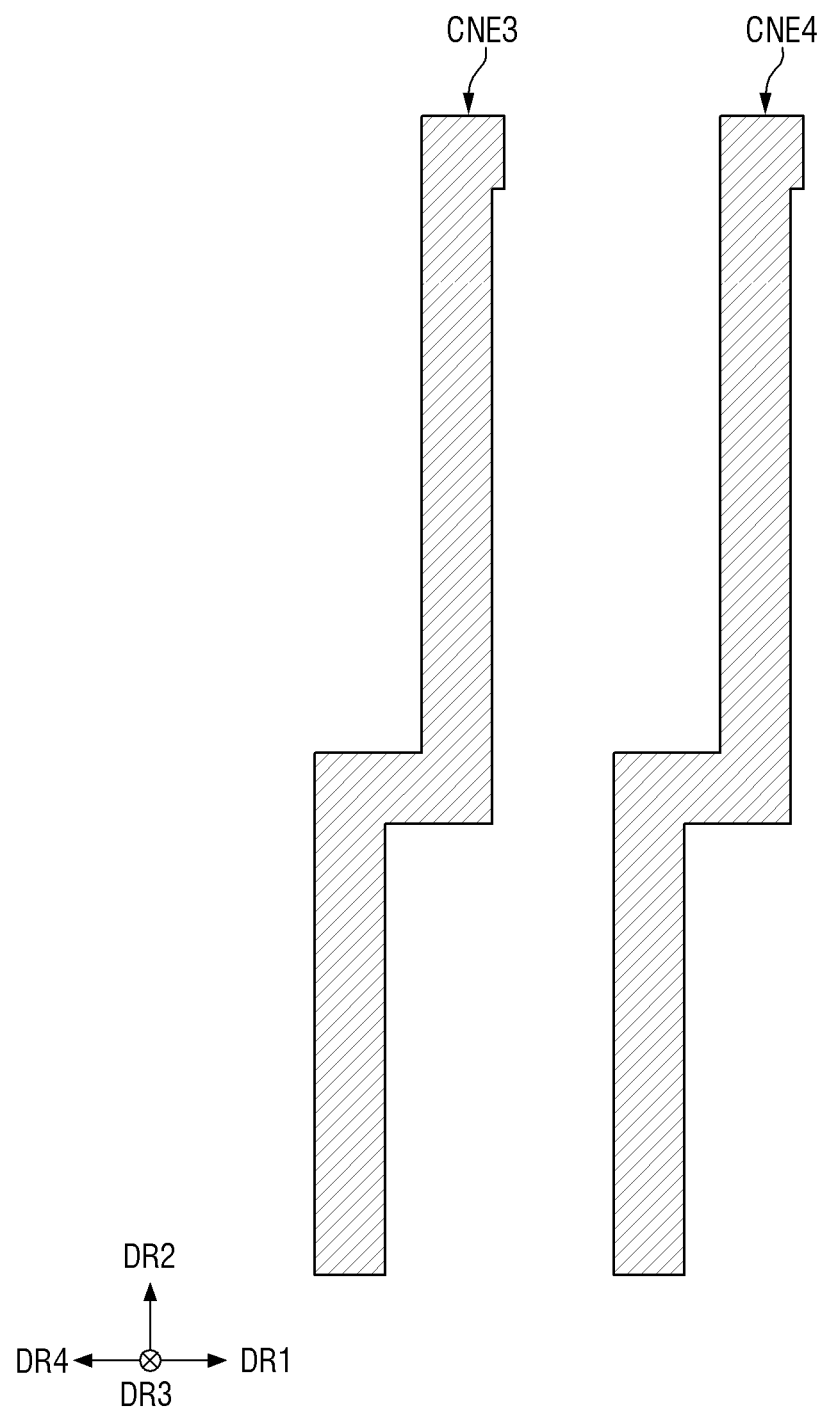
FIG. 8 is a schematic plan view illustrating third and fourth connecting electrodes of FIG. 4.
Figure 9:
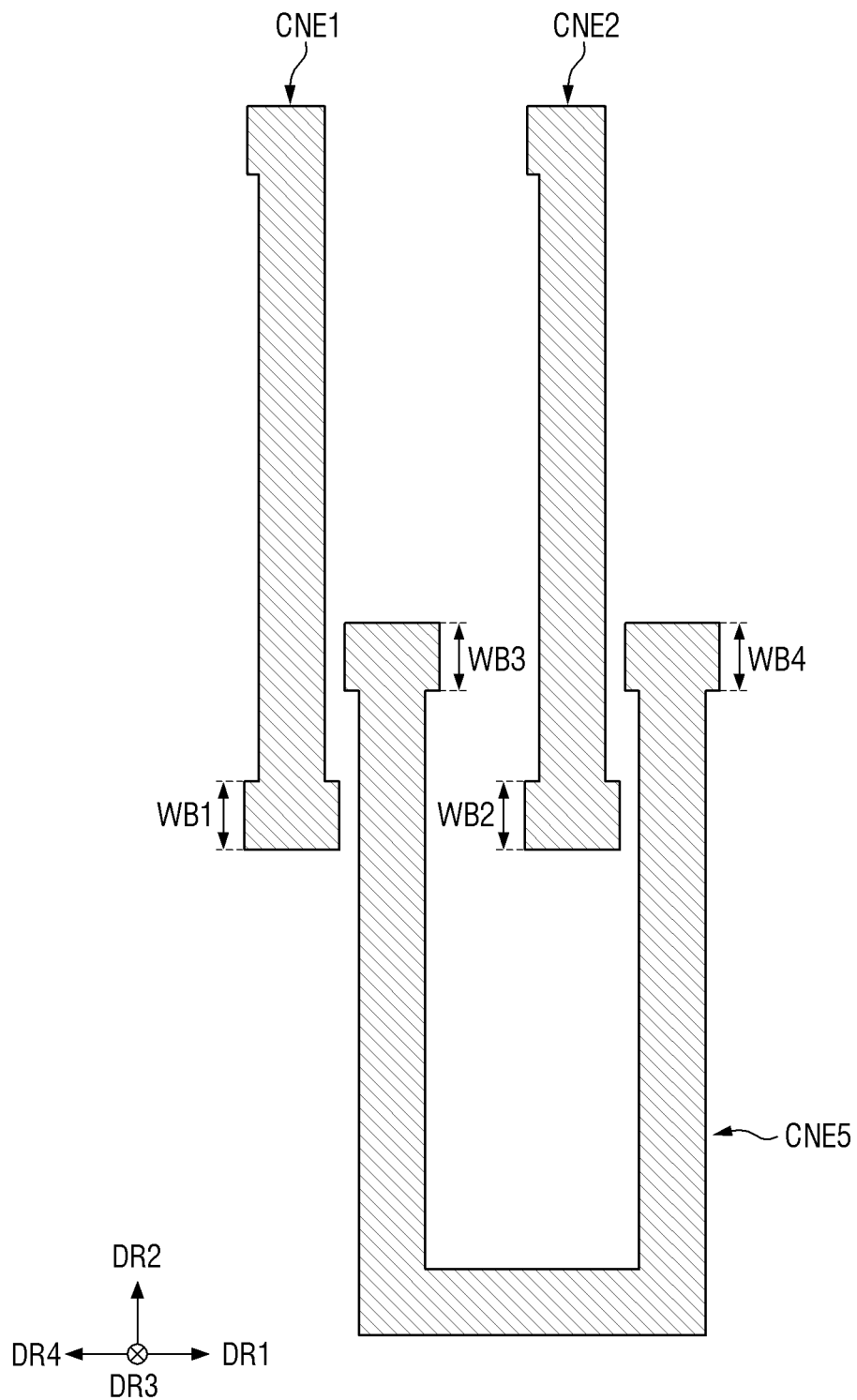
FIG. 9 is a schematic plan view illustrating first, second, and fifth connecting electrodes of FIG. 4.
Figure 10:
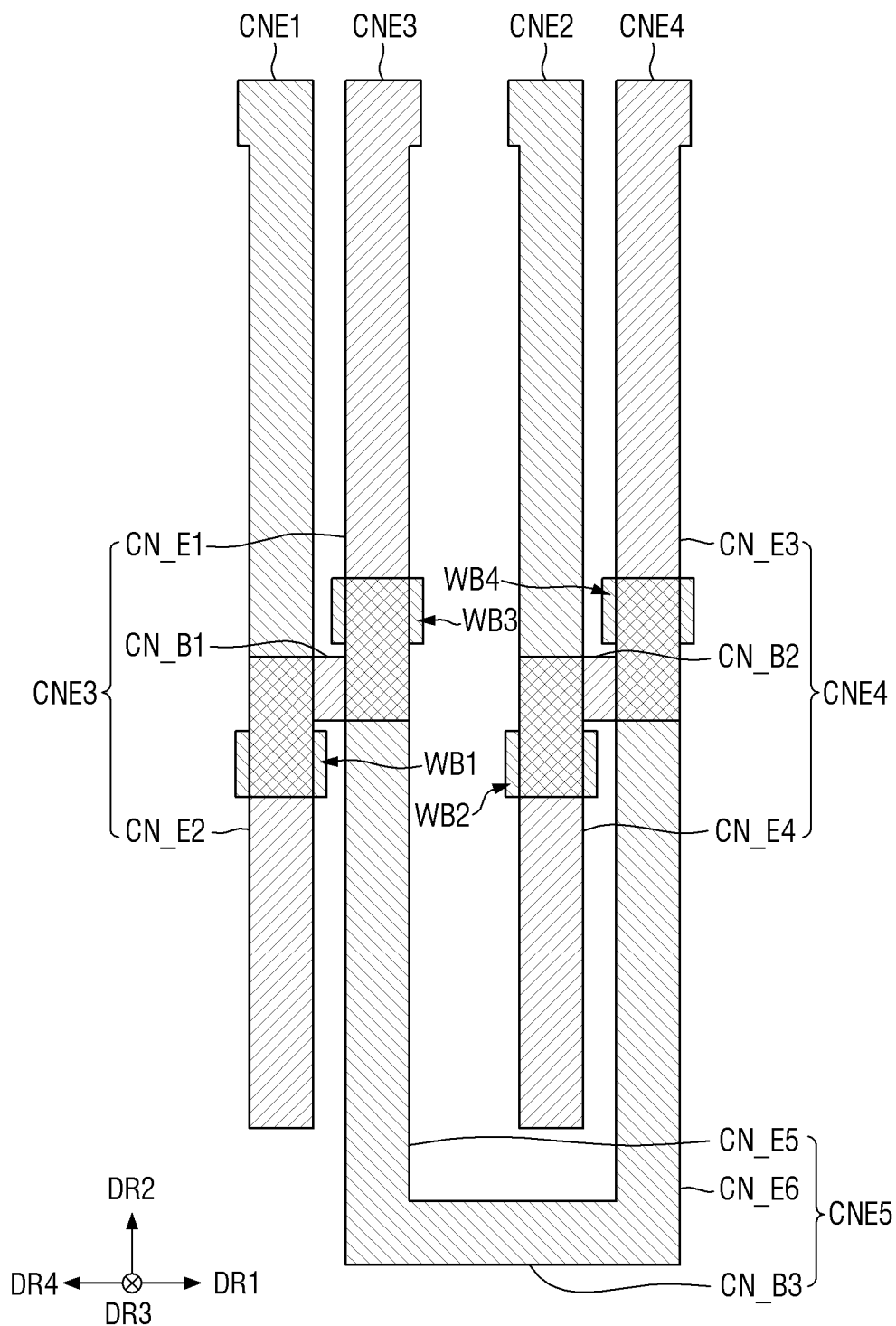
FIG. 10 is a schematic plan view illustrating the layout of the first through fifth connecting electrodes of FIGS. 8 and 9.

FIG. 4 is a schematic plan view of the first subpixel of FIG. 3. FIG. 5 is a schematic cross-sectional view taken along line Q1-Q1' of FIG. 4. FIG. 6 is a schematic cross-sectional view taken along line Q2-Q2' of FIG. 4. FIG. 7 is a schematic cross-sectional view taken along line Q3-Q3' of FIG. 4. FIG. 8 is a schematic plan view illustrating the third and fourth connecting electrodes of FIG. 4. FIG. 9 is a schematic plan view illustrating the first, second, and fifth connecting electrodes of FIG. 4. FIG. 10 is a schematic plan view illustrating the layout of the first to fifth connecting electrodes of FIGS. 8 and 9. Descriptions of features or elements that have already been described above with reference to FIG. 3 will be simplified.

Referring to FIGS. 4 to 7 and further to FIG. 3, the display device 10 may include, in the first subpixel SPX1, a substrate SUB and may further include a semiconductor layer, conductive layers, and insulating layers, which are disposed on the substrate SUB. The semiconductor layer, the conductive layers, and the insulating layers may form a circuit layer (or circuit element) layer and a display element layer of the display device 10.

The substrate SUB may be an insulating substrate. The substrate SUB may be formed of an insulating material such as glass, quartz, or a polymer resin. The substrate SUB may be a rigid substrate or may be a flexible substrate that is bendable, foldable, or rollable.

A first conductive layer may be disposed on the substrate SUB. The first conductive layer includes a lower metal layer CAS, and the lower metal layer CAS is disposed to overlap an active layer ACT of a first transistor T1. The lower metal layer CAS may include a material capable of blocking the transmission of light and may prevent light from being incident upon the active layer ACT of the first transistor T1. The lower metal layer CAS may not be provided.

A buffer layer BL may be disposed on the lower metal layer CAS and the substrate SUB. The buffer layer BL may be formed on the substrate SUB to protect the transistors of the first subpixel SPX1 from moisture that may permeate the substrate SUB, which is vulnerable to moisture, and may perform a surface planarization function.

A semiconductor layer may be disposed on the buffer layer BL. The semiconductor layer may include the active layer ACT of the first transistor T1. The active layer is disposed on the buffer layer BL. The active layer ACT may be disposed to partially overlap a gate electrode G1 of a second conductive layer that will be described below.

The semiconductor layer may include polycrystalline silicon, monocrystalline silicon, or an oxide semiconductor. As another example, the semiconductor layer may include polycrystalline silicon. The oxide semiconductor may be an oxide semiconductor containing indium (In). In an embodiment, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

FIGS. 4 through 7 illustrate that the first subpixel SPX1 includes a transistor, for example, the first transistor T1, but the disclosure is not limited thereto. For example, the first subpixel SPX1 may include more than one transistor.

A gate insulating layer GI is disposed on the active layer ACT and the buffer layer BL. The gate insulating layer GI may function as a gate insulating film for the first transistor T1.

The second conductive layer is disposed on the gate insulating layer GI. The second conductive layer may include a gate electrode G1 of the first transistor T1. The gate electrode G1 may be disposed to overlap the channel region of the active layer ACT in a thickness direction, for example, in a third direction DR3.

An interlayer insulating layer IL is disposed on the second conductive layer. The interlayer insulating layer IL may function as an insulating film between the second conductive layer and layers disposed on the second conductive layer and may protect the second conductive layer.

A third conductive layer is disposed on the interlayer insulating layer IL. The third conductive layer may include first and second voltage lines VL1 and VL2 and electrode patterns (CDP1 and CDP2).

A high-potential voltage (or a first power supply voltage) to be transmitted to a first electrode RME1 may be applied to the first voltage line VL1, and a low-potential voltage (or a second power supply voltage) to be transmitted to a second electrode RME2 may be applied to the second voltage line VL2. A portion of the first voltage line VL1 may contact the active layer ACT of the first transistor T1 through a contact hole that penetrates the interlayer insulating layer IL and the gate insulating layer GI. The first voltage line VL1 may function as a drain electrode D1 of the first transistor T1. The first voltage line VL1 may be directly connected to a first connecting electrode CNE1 that will be described below, and the second voltage line VL2 may be directly connected to a second connecting electrode CNE2 that will be described below.

A first electrode pattern CDP1 may contact the active layer ACT of the first transistor T1 through a contact hole that penetrates the interlayer insulating layer IL and the gate insulating layer GI. The first electrode pattern CDP1 may contact the lower metal layer CAS through another contact hole. The first electrode pattern CDP1 may function as a source electrode S1 of the first transistor T1.

Each of the buffer layer BL, the gate insulating layer GI, and the interlayer insulating layer IL may include inorganic layers that are alternately stacked. In an embodiment, each of the buffer layer BL, the gate insulating layer GI, and the interlayer insulating layer IL may be formed as a double- or multi-layer in which inorganic layers including at least one of silicon oxide ($SiO_x$), silicon nitride ($SiN_x$), and silicon oxynitride ($SiO_xN_y$) are alternately stacked, but the disclosure is not limited thereto. In an embodiment, each of the buffer layer BL, the gate insulating layer GI, and the interlayer insulating layer IL may be formed as a single inorganic layer including silicon oxide ($SiO_x$), silicon nitride ($SiN_x$), or silicon oxynitride ($SiO_xN_y$). In some embodiments, the interlayer insulating layer IL may be formed of an organic insulating material such as polyimide (PI).

The second and third conductive layers may be formed as single layers or multi-layers including at least one of molybdenum (Mo), aluminum (Al), chromium (Cr), gold (Au), titanium (Ti), nickel (Ni), neodymium (Nd), and copper (Cu), or an alloy thereof, but the disclosure is not limited thereto.

A via layer VIA is disposed on the third conductive layer and the interlayer insulating layer IL. The via layer VIA may include an organic insulating material, such as PI, and may perform a surface planarization function.

Electrodes RME (RME1 to RME4), bank patterns BP (BP1 to BP3), light-emitting elements ED, and connecting electrodes CNE (CNE1 to CNE5) are disposed as the display element layer on the via layer VIA. First, second, and third insulating layers PAS1, PAS2, and PAS3 may be disposed on the via layer VIA.

The bank patterns BP may be disposed directly on the via layer VIA. The bank patterns BP may include a first bank pattern BP1, a second bank pattern BP2, and a third bank pattern BP3 which is disposed between the first and second bank patterns BP1 and BP2. The first bank pattern BP1 may be disposed on the left side of the center of the emission area EMA, the second bank pattern BP2 may be disposed on the right side of the center of the emission area EMA, and the third bank pattern BP3 may be disposed in the middle of the emission area EMA. The bank patterns BP may extend in the second direction DR2 and may be spaced apart from one another in the first direction DR1.

The first and second bank patterns BP1 and BP2 may have the same width, but the disclosure is not limited thereto. As another example, the first and second bank patterns BP1 and BP2 may have different widths. The length, in the second direction DR2, of each of the first and second bank patterns BP1 and BP2 may be smaller than the length, in the second direction DR2, of the emission area EMA.

The third bank pattern BP3 may be disposed in the emission area EMA and may extend in the second direction DR2. The third bank pattern BP3 may have a relatively large width in the emission area EMA and may have an island pattern that extends in the second direction DR2. The third bank pattern BP3 may be disposed in the middle of the emission area EMA, and the first bank pattern BP1 and another first bank pattern BP1 may be spaced apart from each other with the second bank pattern BP2 disposed therebetween. The light-emitting elements ED may be disposed between the first and third bank patterns BP1 and BP3 and between the second and third bank patterns BP2 and BP3.

The bank patterns BP may have the same length in the second direction DR2, but may have different widths in the first direction DR1. The first and second bank patterns BP1 and BP2 may have the same width in the first direction DR1, and the width, in the first direction DR1, of the third bank pattern BP3 may be greater than the width, in the first direction DR1, of each of the first and second banks BP1 and BP2. The distance, in the first direction DR1, between the bank patterns BP may be greater than the distance between the electrodes RME. Accordingly, the electrodes RME may be disposed to not overlap, at least in part, the bank patterns BP.

The bank patterns BP may protrude at least in part from the top surface of the via layer VIA. Each of protruding portions of the bank patterns BP may have inclined or curved side surfaces. Unlike what is illustrated in FIG. 5, the bank patterns BP may have a semicircular or semielliptical shape in a cross-sectional view. The bank patterns BP may include an organic insulating material such as PI, but the disclosure is not limited thereto.

Electrodes RME may be disposed in the first subpixel SPX1 to extend in a direction. The electrodes RME may extend in the second direction DR2 to be disposed in and across the emission area EMA and the subarea SA of the first subpixel SPX1 and may be spaced apart from each other in the first direction DR1.

The electrodes RME may include first, second, third, and fourth electrodes RME1, RME2, RME3, and RME4. The third electrode RME3 may be disposed between the first and second electrodes RME1 and RME2, and the fourth electrode RME4 may be spaced apart from the third electrode RME3 in the second direction DR2 with the second electrode RME2 disposed therebetween. The first, second, third, and fourth electrodes RME1, RME2, RME3, and RME4 may be sequentially arranged in a left-to-right direction.

The first electrode RME1 may be disposed on the left side of the center of the emission area EMA to be placed on the first bank pattern BP1. The third electrode RME3 may be disposed on a left portion of the third bank pattern BP3 to face the first electrode RME1, near the first electrode RME1. The fourth electrode RME4 may be disposed on the right side of the center of the emission area EMA to be placed on the second bank pattern BP2. The second electrode RME2 may be disposed on a right portion of the third bank pattern BP3 to be placed between the third and fourth electrodes RME3 and RME4. The first and third electrodes RME1 and RME3 may face each other, and some of the light-emitting elements ED may be disposed between the first and third electrodes RME1 and RME3. The second and fourth electrodes RME2 and RME4 may face each other, and other light-emitting elements ED may be disposed between the second and fourth electrodes RME2 and RME4.

The electrodes RME may be disposed on at least the inclined side surfaces of each of the bank patterns BP. The electrodes RME may be disposed to cover at least the inclined side surfaces of each of the bank patterns BP to reflect light emitted from the light-emitting elements ED. The distance, in the first direction DR1, between the electrodes RME may be smaller than the distance, in the first direction DR1, between the bank patterns BP. At least portions of the electrodes RME may be disposed directly on the via layer VIA and may thus be disposed on the same plane.

The first and second electrodes RME1 and RME2 may be connected to the third conductive layer through first and second electrode contact holes CTD and CTS, respectively, which are formed in areas of the first and second electrodes RME1 and RME2 that overlap the bank BNL. The first electrode RME1 may contact the first conductive pattern CDP1 through the first electrode contact hole CTD, which penetrates the via layer VIA. The second electrode RME2 may contact the second voltage line VL2 through the second electrode contact hole CTS, which penetrates the via layer VIA. The first electrode RME1 may be electrically connected to the first transistor T1 via the first conductive pattern CDP1 and may thus receive the first power supply voltage, and the second electrode RME2 may be electrically connected to the second voltage line VL2 and may thus receive the second power supply voltage. The first and second contact holes CTD and CTS are illustrated as being disposed below the bank BNL, but the disclosure is not limited thereto. As another example, the first and second contact holes CTD and CTS may be disposed in the emission area EMA or in the subarea SA.

The third and fourth electrodes RME3 and RME4 may not be connected directly to the third conductive layer and may be electrically connected to the first and second electrodes RME1 and RME2 via the light-emitting elements ED and the connecting electrodes CNE. The first and second electrodes RME1 and RME2 may be first-type electrodes directly connected to the third conductive layer via the first and second electrode contact holes CTD and CTS, and the third and fourth electrodes RME3 and RME4 may be second-type electrodes not connected directly to the third conductive layer. The second-type electrodes may provide electrical connections for the light-emitting elements ED together with the connecting electrodes CNE.

Two groups of electrodes RME of two adjacent subpixels SPXn in the second direction DR2 or in the opposite direction of the second direction DR2 may be separated from each other in a separation part ROP of a subarea SA of one of the two adjacent subpixels SPXn. This arrangement of the electrodes RME may be obtained by forming the electrodes RME as single electrode lines that extend in the second direction DR2 and cutting up (or separating) the electrode lines in each subpixel SPXn after the alignment of the light-emitting elements ED. The electrode lines may be used to form an electric field in each subpixel SPXn to align the light-emitting elements ED.

Specifically, after the alignment of the light-emitting elements ED in the first subpixel SPX1, the electrode lines may be cut in a separation part ROP of the first subpixel SPX1, and electrodes RME that are separated from electrodes RME of a neighboring subpixel SPXn adjacent to the first subpixel SPX1 in the second direction DR2 may be formed. This process may be performed after the formation of the second insulating layer PAS2, and the second insulating layer PAS2 may not be disposed in the separation part ROP of the first subpixel SPX1. The second insulating layer PAS2 may be used as a mask pattern during the cutting up of the electrode lines.

The electrodes RME may be electrically connected to the light-emitting elements ED. The electrodes RME may be connected to the light-emitting elements ED via the connecting electrodes CNE and may transmit electrical signals applied thereto from the conductive layers below the via layer VIA to the light-emitting elements ED.

The electrodes RME may include a conductive material with high reflectance. In an embodiment, the electrodes RME may include a material with high reflectance, for example, a metal such as silver (Ag), Cu, or Al, or an alloy of Al, Ni, or lanthanum (La). The electrodes RME may upwardly reflect light emitted by the light-emitting elements ED and traveling toward side surfaces of the bank patterns BP.

However, the disclosure is not limited thereto. As another example, the electrodes RME may further include a transparent conductive material. In an embodiment, the electrodes RME may include a material such as ITO, IZO, or ITZO. In some embodiments, the electrodes RME may be formed as a stack of more than one layer formed of a transparent conductive material and more than one metal layer with high reflectance or as single layers including a transparent conductive material and a metal with high reflectance. In an embodiment, the electrodes RME may have a stack of ITO/Ag/ITO/, ITO/Ag/IZO, or ITO/Ag/ITZO/IZO.

The first insulating layer PAS1 may be disposed on the via layer VIA, the bank patterns BP, and the electrodes RME. The first insulating layer PAS1 may be disposed on the via layer VIA to cover (or overlap) the electrodes RME and the bank patterns BP. The first insulating layer PAS1 may not be disposed in the separation part ROP where the electrodes RME of the first subpixel SPX1 and the electrodes RME of the neighboring subpixel SPXn are separated. The first insulating layer PAS1 can protect the electrodes RME and can insulate the electrodes RME from one another. The first insulating layer PAS1 can prevent the light-emitting elements ED from being damaged by directly contacting other elements.

In an embodiment, the first insulating layer PAS1 may be formed to be recessed in part between electrodes RME that are spaced apart from each other in the first direction DR1. The light-emitting elements ED may be disposed on the top surface of a portion of the first insulating layer PAS1 that is recessed, and a space may be formed between the light-emitting elements ED and the first insulating layer PAS1.

The first insulating layer PAS1 may include contacts CT, which expose portions of the top surfaces of the electrodes RME. The contacts CT may penetrate the first insulating layer PAS1, and the connecting electrodes CNE that will be described below may contact portions of the electrodes RME exposed by the contacts CT. The contacts CT may include first, second, third, and fourth contacts CT1, CT2, CT3, and CT4, which overlap the first, second, third, and fourth electrodes RME1, RME2, RME3, and RME4, respectively. The first electrode RME1 and the first connecting electrode CNE1 may be connected to the first contact CT1, and the second electrode RME2 may be connected to the second contact CT2. The third electrode RME3 and a third connecting electrode CNE3 may be connected to the third contact CT3, and the fourth electrode RME4 and a fourth connecting electrode CNE4 may be connected to the fourth contact CT4.

The bank BNL may be disposed on the first insulating layer PAS1. The bank BNL may include parts that extend in the first direction DR1 and parts that extend in the second direction DR2 and may thus be arranged in a lattice pattern in a plan view. The bank BNL may be disposed along the boundaries of the first subpixel SPX1 to separate the first subpixel SPX1 from other neighboring subpixels SPXn. The bank BNL may be disposed to surround the emission area EMA and the subarea SA of the first subpixel SPX1, and areas that are defined and opened by the bank BNL may be the emission area EMA and the subarea SA of the first subpixel SPX1.

The bank BNL may have a predetermined height. In some embodiments, the height of the bank BNL may be greater than the height of the bank patterns BP, and the thickness of the bank BNL may be greater than or equal to the thickness of the bank patterns BP. However, the disclosure is not limited thereto. As another example, the height of the bank BNL may be smaller than or equal to the height of the bank patterns BP. The bank BNL may prevent ink from overflowing into a neighboring subpixel SPXn during an inkjet printing during the fabrication of the display device 10. The bank BNL may prevent ink having different groups of light-emitting elements ED for different subpixels SPXn from being mixed with each other. Similar to the bank patterns BP, the bank BNL may include PI (polyimide), but the disclosure is not limited thereto.

The light-emitting elements ED may be disposed on the first insulating layer PAS1. Each of the light-emitting elements ED may include layers that are arranged in a direction parallel to the top surface of the substrate SUB. The light-emitting elements ED may be arranged such that a direction in which the light-emitting elements ED extend may be parallel to the substrate SUB, and the semiconductor layers included in each of the light-emitting elements ED may be sequentially arranged in a direction parallel to the top surface of the substrate SUB. However, the disclosure is not limited thereto. As another example, the layers included in each of the light-emitting elements ED may be arranged in a direction perpendicular to the substrate SUB.

The light-emitting elements ED may be disposed between the bank patterns BP or between the electrodes RME. Some of the light-emitting elements ED may be disposed between the first and third bank patterns BP1 and BP3, and other light-emitting elements ED may be disposed between the second and third bank patterns BP2 and BP3. In an embodiment, the light-emitting elements ED may include first light-emitting elements ED1 and third light-emitting elements ED3, which are disposed between the first and third bank patterns BP1 and BP3, and second light-emitting elements ED2 and fourth light-emitting elements ED4, which are disposed between the second and third bank patterns BP2 and BP3. The first light-emitting elements ED1 and the third light-emitting elements ED3 may be disposed on the first and third electrodes RME1 and RME3, respectively, and the second light-emitting elements ED2 and the fourth light-emitting elements ED4 may be disposed on the second and fourth electrodes RME2 and RME4, respectively. The first light-emitting elements ED1 and the second light-emitting elements ED2 may be disposed in an upper portion of the emission area EMA or near the subarea SA, and the third light-emitting elements ED3 and the fourth light-emitting elements ED4 may be disposed in a lower portion of the emission area EMA. The light-emitting elements ED may be classified not by their locations in the emission area EMA, but by how they are connected to the connecting electrodes CNE. Depending on an arrangement of the connecting electrodes CNE to be described below, end portions of each of the light-emitting elements ED may contact different connecting electrodes CNE, and the light-emitting elements ED may be classified into different types of light-emitting elements ED depending on the types of connecting electrodes CNE to which the light-emitting elements ED are connected.

The light-emitting elements ED may contact, and thereby electrically connected to, the connecting electrodes CNE. As some of the semiconductor layers of each of the light-emitting elements ED are exposed on both end surfaces of each of the light-emitting elements ED, the exposed semiconductor layers may contact the connecting electrodes CNE. The first connecting electrode CNE1 may contact the first end portions of the first light-emitting elements ED1, and a portion of the third connecting electrode CNE3 may contact the second end portions of the first light-emitting elements ED1. The second connecting electrode CNE2 may contact the first end portions of the second light-emitting elements ED2, and a portion of the fourth connecting electrode CNE4 may contact the second end portions of the second light-emitting elements ED2. The third connecting electrode CNE3 may contact the first end portions of the third light-emitting elements ED3, and a portion of the fifth connecting electrode CNE5 may contact the second end portions of the third light-emitting elements ED3. A portion of the fourth connecting electrode CNE4 may contact the first end portions of the fourth light-emitting elements ED4, and a portion of the fifth connecting electrode CNE5 may contact the second end portions of the fourth light-emitting elements ED4. The light-emitting elements ED may be electrically connected to the electrodes RME and the conductive layers below the via layer VIA through the connecting electrodes CNE. As electrical signals are applied to the light-emitting elements ED, the light-emitting elements ED may emit light of a particular wavelength range.

The second insulating layer PAS2 may be disposed on the light-emitting elements ED and the first insulating layer PAS1. The second insulating layer PAS2 may extend in the second direction DR2 between the bank patterns BP and may be disposed on the light-emitting elements ED. The second insulating layer PAS2 may be disposed to surround portions of the outer surfaces of each of the light-emitting elements ED, but not cover both sides or both end portions of each of the light-emitting elements ED. The second insulating layer PAS2 may form linear or island patterns in the first subpixel SPX1 in a plan view. The second insulating layer PAS2 may protect the light-emitting elements ED and may fix the light-emitting elements ED during the fabrication of the display device 10. The second insulating layer PAS2 may fill the spaces between the light-emitting elements ED and the first insulating layer PAS1 disposed below the light-emitting elements ED. Portions of the second insulating layer PAS2 may be disposed on the bank BNL and in the subarea SA, but the disclosure is not limited thereto. The second insulating layer PAS2 may be disposed in the subarea SA, but not in the first and second contacts CT1 and CT2 and the separation part ROP.

The connecting electrodes CNE may be disposed on the light-emitting elements ED, the electrodes RME, and the bank patterns BP. The connecting electrodes CNE may contact the light-emitting elements ED and the electrodes RME. The connecting electrodes CNE may directly contact the semiconductor layers exposed on both end surfaces of each of the light-emitting elements ED and may contact at least one of the electrodes RME through the contacts CT, which penetrate the first and second insulating layers PAS1 and PAS2. Both end portions of each of the light-emitting elements ED may be electrically connected to the electrodes RME via the connecting electrodes CNE.

The first connecting electrode CNE1 may extend in the second direction DR2 and may be disposed on the first electrode RME1 and the first bank pattern BP1. Portions of the first connecting electrode CNE1 may overlap the first electrode RME1 and the first bank pattern BP1 and may extend in the first direction DR1 from the first electrode RME1 and the first bank pattern BP1. The first connecting electrode CNE1 may be disposed in and across the emission area EMA and the subarea SA, beyond the bank BNL. The first connecting electrode CNE1 may contact the first electrode RME1 through the first contact CT1, which exposes the first electrode RME1. The first connecting electrode CNE1 may contact the light-emitting elements ED and the first electrode RME1 and may thus transmit electrical signals applied thereto from the first transistor T1 to the light-emitting elements ED.

The second connecting electrode CNE2 may extend in the second direction DR2 and may be disposed on the second electrode RME2. Portions of the second connecting electrode CNE2 may overlap the second bank pattern BP2 and may extend in the first direction DR1 from the second bank pattern BP2. The second connecting electrode CNE2 may be disposed in and across the emission area EMA and the subarea SA, beyond the bank BNL. The second connecting electrode CNE2 may contact the second electrode RME2 through the second contact CT2, which exposes the second electrode RME2. The second connecting electrode CNE2 may contact the light-emitting elements ED and the second electrode RME2 and may thus transmit electrical signals applied thereto from the second voltage line VL2 to the light-emitting elements ED.

The lengths of the first and second connecting electrodes CNE1 and CNE2 may be smaller than the length of the other connecting electrodes CNE. The first and second connecting electrodes CNE1 and CNE2 may be disposed on the upper side of the center of the emission area EMA, but the disclosure is not limited thereto. As another example, in a case where the subarea SA is disposed below the emission area EMA, the first and second connecting electrodes CNE1 and CNE2 may be disposed on the lower side of the center of the emission area EMA.

The third connecting electrode CNE3 may include a first extension CN_E1, which is disposed on the third electrode RME3, a second extension CN_E2, which is disposed on the first electrode RME1, and a first connector CN_B1, which connects the first and second extensions CN_E1 and CN_E2. The first extension CN_E1 may be spaced apart from, and face, the first connecting electrode CNE1 in the first direction DR1, and the second extension CN_E2 may at least partially overlap the first connecting electrode CNE1. The first extension CN_E1 may be disposed in the upper portion of the emission area EMA, and the second extension CN_E2 may be disposed in the lower portion of the emission area EMA. The first extension CN_E1 may be disposed in and across the emission area EMA and the subarea SA and may be connected to the third electrode RME3 through the third contact CT3, which is formed in the subarea SA. The first connector CN_B1 may be disposed over the first and third electrodes RME1 and RME3, in the middle of the emission area EMA. The third connecting electrode CNE3 may generally extend in the second direction DR2. The third connecting electrode CNE3 may be bent in the first direction DR1 and may extend in the second direction DR2.

The fourth connecting electrode CNE4 may include a third extension CN_E3, which is disposed on the fourth electrode RME4, a fourth extension CN_E4, which is disposed on the second electrode RME2, and a second connector CN_B2, which connects the third and fourth extensions CN_E3 and CN_E4. The third extension CN_E3 may be spaced apart from, and face, the second connecting electrode CNE2 in the first direction DR1, and the fourth extension CN_E4 may at least partially overlap the second connecting electrode CNE2. The third extension CN_E3 may be disposed in the upper portion of the emission area EMA, and the fourth extension CN_E4 may be disposed in the lower portion of the emission area EMA. The third extension CN_E3 may be disposed in and across the emission area EMA and the subarea SA and may be connected to the fourth electrode RME4 through the fourth contact CT4. The second connector CN_B2 may be disposed over the second and fourth electrodes RME2 and RME4, near the center of the emission area EMA. The fourth connecting electrode CNE4 may generally extend in the second direction DR2. The fourth connecting electrode CNE4 may be bent in the first direction DR1 and may extend in the second direction DR2.

The fifth connecting electrode CNE5 may include a fifth extension CN_E5, which is disposed on the third electrode RME3, a sixth extension CN_E6, which is disposed on the fourth electrode RME4, and a third connector CN_B3, which connects the fifth and sixth extensions CN_E5 and CN_E6. The fifth extension CN_E5 may be spaced apart from, and face, the second extension CN_E2 of the third connecting electrode CNE3 in the first direction DR1, and the sixth extension CN_E6 may be spaced apart from, and face, the fourth extension CN_E4 of the fourth connecting electrode CNE4 in the first direction DR1. The fifth and sixth extensions CN_E5 and CN_E6 may be disposed in the lower portion of the emission area EMA, and the third connector CN_B3 may be disposed over the second, third, and fourth electrodes RME2, RME3, and RME4. The fifth connecting electrode CNE5 may be disposed to surround the fourth extension CN_E4 of the fourth connecting electrode CNE4 in a plan view.

The first and second connecting electrodes CNE1 and CNE2 may be first-type connecting electrodes contacting the first and second electrodes RME1 and RME2, which are directly connected to the third conductive layer, the third and fourth connecting electrodes CNE3 and CNE4 may be second-type connecting electrodes contacting the third and fourth electrodes RME3 and RME4, which are not directly connected to the third conductive layer, and the fifth connecting electrode CNE5 may be a third-type connecting electrode not contacting the electrodes RME.

As described above, the light-emitting elements ED may be classified into different types of light-emitting elements depending on the connecting electrodes CNE connected thereto.

The first end portions of the first light-emitting elements ED1 and the first end portions of the second light-emitting elements ED2 may contact the first-type connecting electrodes, and the second end portions of the first light-emitting elements ED1 and the second end portions of the second light-emitting elements ED2 may contact the second-type connecting electrodes. The first light-emitting elements ED1 may contact the first and third connecting electrodes CNE1 and CNE3, and the second light-emitting elements ED2 may contact the second and fourth connecting electrodes CNE2 and CNE4. The first end portions of the third light-emitting elements ED3 and the first end portions of the fourth light-emitting elements ED4 may contact the second-type connecting electrodes, and the second end portions of the first light-emitting elements ED1 and the second end portions of the second light-emitting elements ED2 may contact the third-type connecting electrode. The third light-emitting elements ED3 may contact the third and fifth connecting electrodes CNE3 and CNE5, and the fourth light-emitting elements ED4 may contact the fourth and fifth connecting electrodes CNE4 and CNE5.

The light-emitting elements ED may be connected in series by the connecting electrodes CNE. As the display device 10 includes a number of light-emitting elements ED in each subpixel SPXn and can form serial connections between the light-emitting elements ED, the amount of light emitted per unit area can be further increased.

At least one end portion of each of the first, second, and fifth connecting electrodes CNE1, CNE2, and CNE5 may overlap the other connecting electrodes CNE.

Referring to FIGS. 7 to 10 and further to FIG. 4, the first connecting electrode CNE1 may include a first part WB1, which has a width larger than widths of other parts of the first connecting electrode CNE1 in the first direction DR1. The first part WB1 may be an end portion of the first connecting electrode CNE1 in the emission area EMA. The first part WB1 may overlap a portion of the third connecting electrode CNE3, particularly, the second extension CN_E2 of the third connecting electrode CNE3. The first and third connecting electrodes CNE1 and CNE3 may be spaced apart from each other in the third direction DR3 with the third insulating layer PAS3 disposed therebetween. A portion of the first connecting electrode CNE1 other than the first part WB1 may overlap the first connector CN_B1 of the third connecting electrode CNE3. The first part WB1 of the first connecting electrode CNE1 may be spaced apart from the first connector CN_B1 of the third connecting electrode CNE3 in the second direction DR2 and may thus not overlap the first connector CN_B1 of the third connecting electrode CNE3.

The second connecting electrode CNE2 may include a second part WB2, which has a relatively large width in the first direction DR1. The second part WB2 may be an end portion of the second connecting electrode CNE2 in the emission area EMA. The second part WB2 may overlap a portion of the fourth connecting electrode CNE4, particularly, the fourth extension CN_E4 of the fourth connecting electrode CNE4. The second and fourth connecting electrodes CNE2 and CNE4 may be spaced apart from each other in the third direction DR3 with the third insulating layer PAS3 disposed therebetween. A portion of the second connecting electrode CNE2 other than the second part WB2 may overlap the second connector CN_B2 of the fourth connecting electrode CNE4. The second part WB2 of the second connecting electrode CNE2 may be spaced apart from the second connector CN_B2 of the fourth connecting electrode CNE4 in the second direction DR2 and may thus not overlap the second connector CN_B2 of the fourth connecting electrode CNE4.

The fifth and sixth extensions CN_E5 and CN_E6 of the fifth connecting electrode CNE5 extending in the second direction DR2 may include third and fourth parts WB3 and WB4, respectively, which have a width larger than widths of other parts of the fifth and sixth extensions CN_E5 and CN_E6 in the first direction DR1. The third and fourth parts WB3 and WB4 may have the same width. The third part WB3 may be an end portion of the fifth extension CN_E5 of the fifth connecting electrode CNE5 in the emission area EMA. The fourth part WB4 may be an end portion of the sixth extension CN_E6 of the fifth connecting electrode CNE5 in the emission area EMA.

The third part WB3 may overlap a portion of the third connecting electrode CNE3 and the first extension CN_E1 of the third connecting electrode CNE3. A portion of the fifth connecting electrode CNE5 other than the third part WB3 may overlap the first connector CN_B1 of the third connecting electrode CNE3. The third part WB3 of the fifth connecting electrode CNE5 may be spaced apart from the first connector CN_B1 of the third connecting electrode CNE3 in the second direction DR2 and may thus not overlap the first connector CN_B1 of the third connecting electrode CNE3.

The fourth part WB4 may overlap a portion of the fourth connecting electrode CNE4 and the third extension CN_E3 of the fourth connecting electrode CNE4. A portion of the fifth connecting electrode CNE5 other than the fourth part WB4 may overlap the second connector CN_B2 of the fourth connecting electrode CNE4. The fourth part WB4 of the fifth connecting electrode CNE5 may be spaced apart from the second connector CN_B2 of the fourth connecting electrode CNE4 in the second direction DR2 and may thus not overlap the second connector CN_B2 of the fourth connecting electrode CNE4. The third and fifth connecting electrodes CNE3 and CNE5 may be spaced apart from each other in the third direction DR3 with the third insulating layer PAS3 disposed therebetween. The fourth and fifth connecting electrodes CNE4 and CNE5 may be spaced apart from each other in the third direction DR3 with the third insulating layer PAS3 disposed therebetween.

In an embodiment, in case that the first connector CN_B1 of the third connecting electrode CNE3 is electrically disconnected, the third connecting electrode CNE3 may be repaired by connecting the first part WB1 of the first connecting electrode CNE1 and the second extension CN_E2 of the third connecting electrode CNE3, which overlaps the first part WB1 of the first connecting electrode CNE1. As will be described below, the third connecting electrode CNE3 may be repaired by applying laser light to the overlapping area of the first part WB1 and the second extension CN_E2 to form a hole and filling the hole with conductive ink to electrically connect the first part WB1 of the first connecting electrode CNE1 and the second extension CN_E2 of the third connecting electrode CNE3. In another example, in a case where the first connector CN_B1 of the third connecting electrode CNE3 is electrically disconnected, the third connecting electrode CNE3 may be repaired by connecting the third part WB3 of the fifth connecting electrode CNE5 and the first extension CN_E1 of the third connecting electrode CNE3, which overlaps the third part WB3 of the fifth connecting electrode CNE5.

In an embodiment, in case that the second extension CN_B2 of the fourth connecting electrode CNE4 is electrically disconnected, the fourth connecting electrode CNE4 may be repaired by connecting the second part WB2 of the second connecting electrode CNE2 and the fourth extension CN_E4 of the fourth connecting electrode CNE4, which overlaps the second part WB2 of the second connecting electrode CNE2. In an embodiment, in case that the second extension CN_B2 of the fourth connecting electrode CNE4 is electrically disconnected, the fourth connecting electrode CNE4 may be repaired by connecting the fourth part WB4 of the fifth connecting electrode CNE5 and the third extension CN_E3 of the fourth connecting electrode CNE4, which overlaps the fourth part WB4 of the fifth connecting electrode CNE5.

As described above, as each pair of connecting electrodes CNE with the third insulating layer PAS3 interposed therebetween is disposed to partially overlap each other, any dark spots by a disconnected connector of the third or fourth connecting electrode CNE3 or CNE4 can be repaired.

Figure 11:
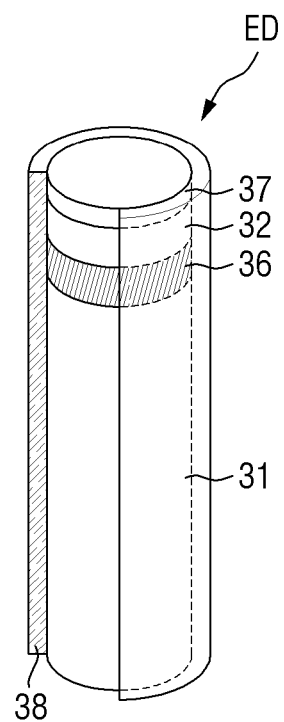
FIG. 11 is a schematic perspective view of a light-emitting element according to an embodiment of the disclosure.

FIG. 11 is a schematic perspective view of a light-emitting element according to an embodiment.

Referring to FIG. 11, a light-emitting element ED may be a light-emitting diode (LED), particularly, an ILED having a size of several nanometers or micrometers and formed of an inorganic material. If an electric field is formed in a particular direction between two opposite electrodes, the light-emitting element ED may be aligned between the two electrodes where polarities are formed.

The light-emitting element ED may have a shape that extends in a direction. The light-emitting element ED may have the shape of a cylinder, a rod, a wire, or a tube, but the shape of the light-emitting element ED is not particularly limited. As another example, the light-emitting element ED may have the shape of a polygonal column such as a regular cube, a rectangular parallelepiped, or a hexagonal column or may extend in a direction and have a partially inclined outer surface.

The light-emitting element ED may include semiconductor layers doped with impurities of an arbitrary conductivity type (e.g., a p type or an n type). The semiconductor layers may receive electrical signals from an external power source to emit light of a particular wavelength range. The light-emitting element ED may include a first semiconductor layer 31, a second semiconductor layer 32, a light-emitting layer 36, an electrode layer 37, and an insulating film 38.

The first semiconductor layer 31 may include an n-type semiconductor. The first semiconductor layer 31 may include a semiconductor material, for example, $Al_xGa_yIn_{1-x-y}N$ (where $0 \le x \le 1$, $0 \le y \le 1$, and $0 \le x+y \le 1$). In an embodiment, the first semiconductor layer 31 may include at least one of AlGaInN, GaN, AlGaN, InGaN, AlN, and InN that are doped with an n-type dopant. The n-type dopant may be Si, Ge, or Sn.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material, for example, $Al_xGa_yIn_{1-x-y}N$ (where $0 \le x \le 1$, $0 \le y \le 1$, and $0 \le x+y \le 1$). In an embodiment, the second semiconductor layer 32 may include at least one of AlGaInN, GaN, AlGaN, InGaN, AlN, and InN that are doped with a p-type dopant. The p-type dopant may be Mg, Zn, Ca, Se, or Ba.

FIG. 11 illustrates that the first and second semiconductor layers 31 and 32 are formed as single layers, but the disclosure is not limited thereto. As another example, each of the first and second semiconductor layers 31 and 32 may include more than a layer such as a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a material having a single or multi-quantum well structure. In case that the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. The light-emitting layer 36 may include a material such as AlGaN or AlGaInN. In particular, in case that the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN.

The light-emitting layer 36 may have a structure in which a semiconductor material having a large band gap energy and a semiconductor material having a small band gap energy are alternately stacked or may include group III to V semiconductor materials depending on the wavelength of light to be emitted. The type of light emitted by the light-emitting layer 36 is not particularly limited. The light-emitting layer 36 may emit light of a red or green wavelength range as necessary, instead of blue light.

The electrode layer 37 may be an ohmic connecting electrode, but the disclosure is not limited thereto. As another example, the electrode layer 37 may be a Schottky connecting electrode. The light-emitting element ED may include at least one electrode layer 37. The light-emitting element ED may include more than one electrode layer 37, but the disclosure is not limited thereto. As another example, the electrode layer 37 may not be provided.

The electrode layer 37 may reduce the resistance between the light-emitting element ED and connecting electrodes CNE in case that the light-emitting element ED is electrically connected to the connecting electrodes CNE. The electrode layer 37 may include a conductive metal. In an embodiment, the electrode layer 37 may include at least one of Al, Ti, In, Au, Ag, ITO, IZO, and ITZO.

The insulating film 38 may be disposed to surround the first and second semiconductor layers 31 and 32 and the electrode layer 37. In an embodiment, the insulating film 38 may be disposed to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as silicon oxide ($SiO_x$), silicon nitride ($SiN_x$), silicon oxynitride ($SiO_xN_y$), aluminum nitride ($AlN_x$), or aluminum oxide ($AlO_x$). The insulating film 38 is illustrated as being a single-layer film, but the disclosure is not limited thereto. As another example, in some embodiments, the insulating film 38 may be formed as a multi-layer film in which multiple layers are stacked.

The insulating film 38 may protect the other elements (e.g., first semiconductor layer 31, the second semiconductor layer 32, the light-emitting layer 36, and the electrode layer 37) of the light-emitting element ED. The insulating film 38 can prevent any short circuit that may occur in the light-emitting element 36 in case that the light-emitting element ED directly contacts electrodes to which electrical signals are applied. The insulating film 38 can prevent the degradation of the emission efficiency of the light-emitting element ED.

The outer surface of the insulating film 38 may be subjected to a surface treatment. The light-emitting element ED may be sprayed on electrodes while being dispersed in predetermined ink. Here, the surface of the insulating film 38 may be hydrophobically or hydrophilically treated to keep the light-emitting element ED dispersed in ink without agglomerating with other neighboring light-emitting elements ED.

Figure 12:
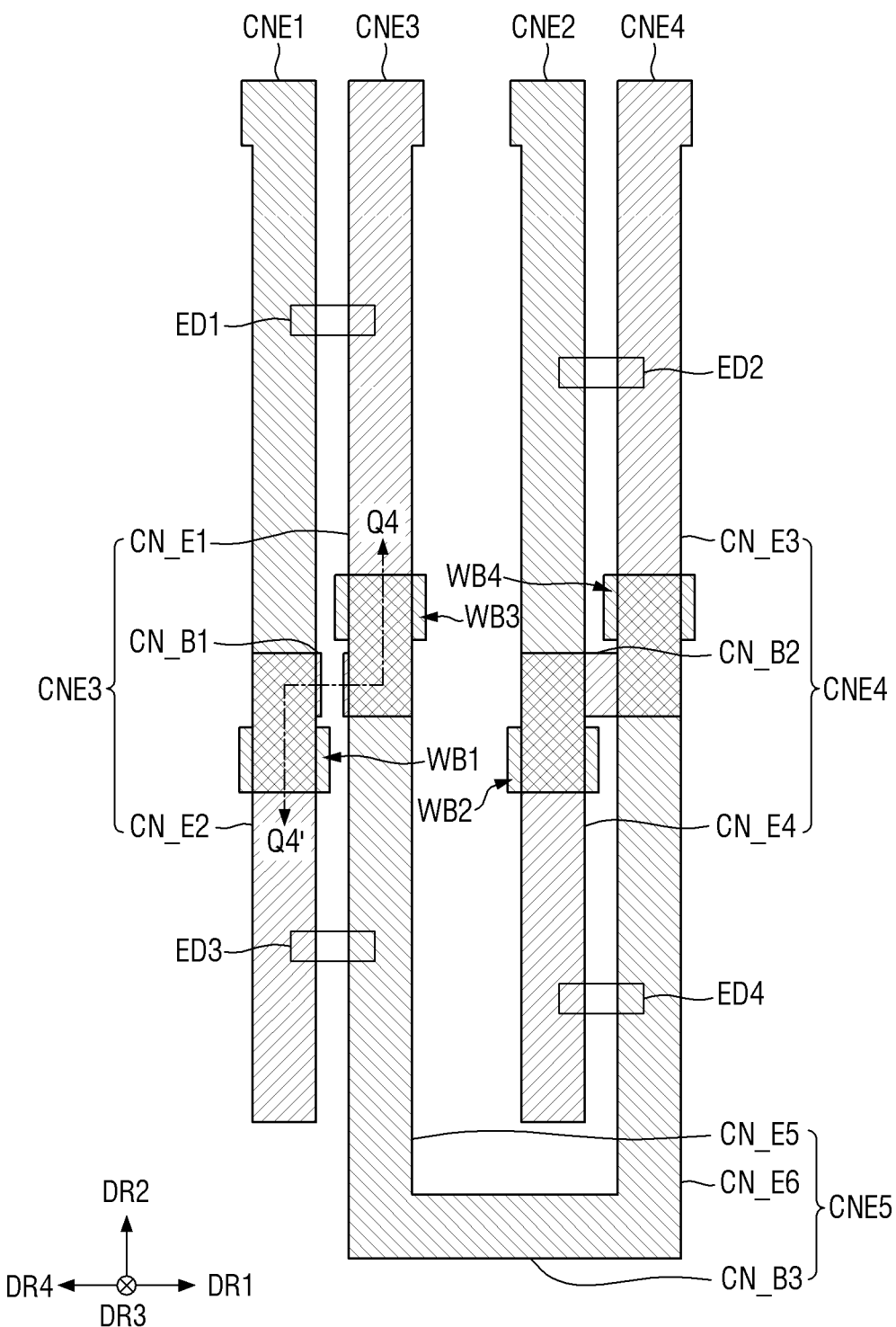
FIGS. 12 to 16 are schematic plan views or schematic cross-sectional views illustrating a repair process for a display device according to an embodiment of the disclosure.
Figure 13:
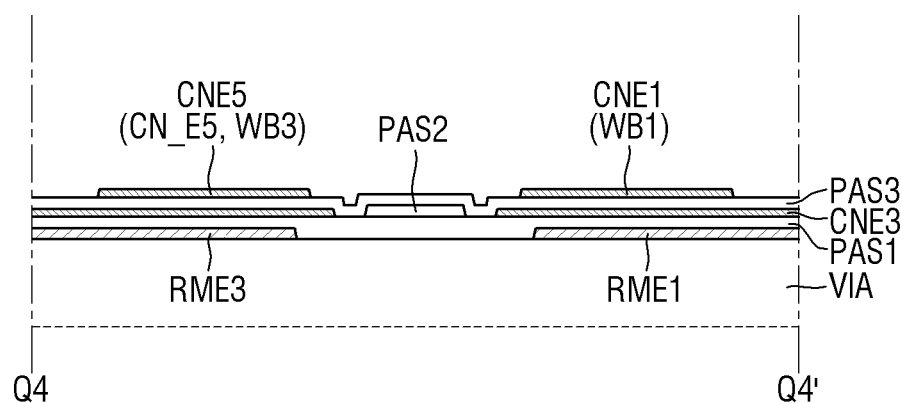
Figure 14:
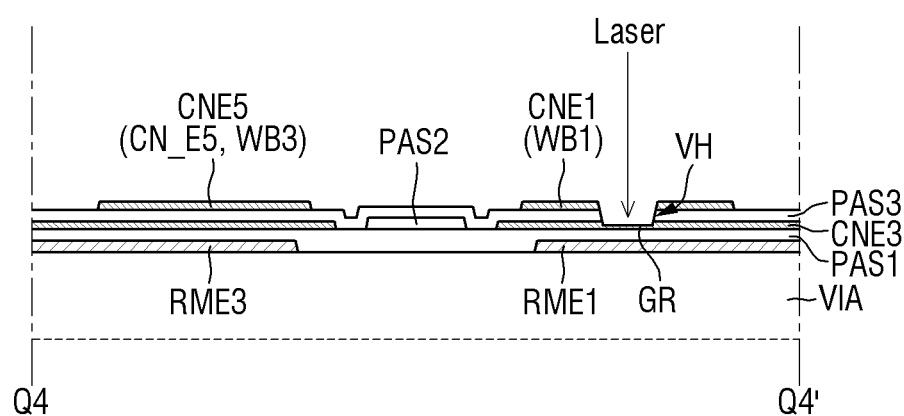
Figure 15:
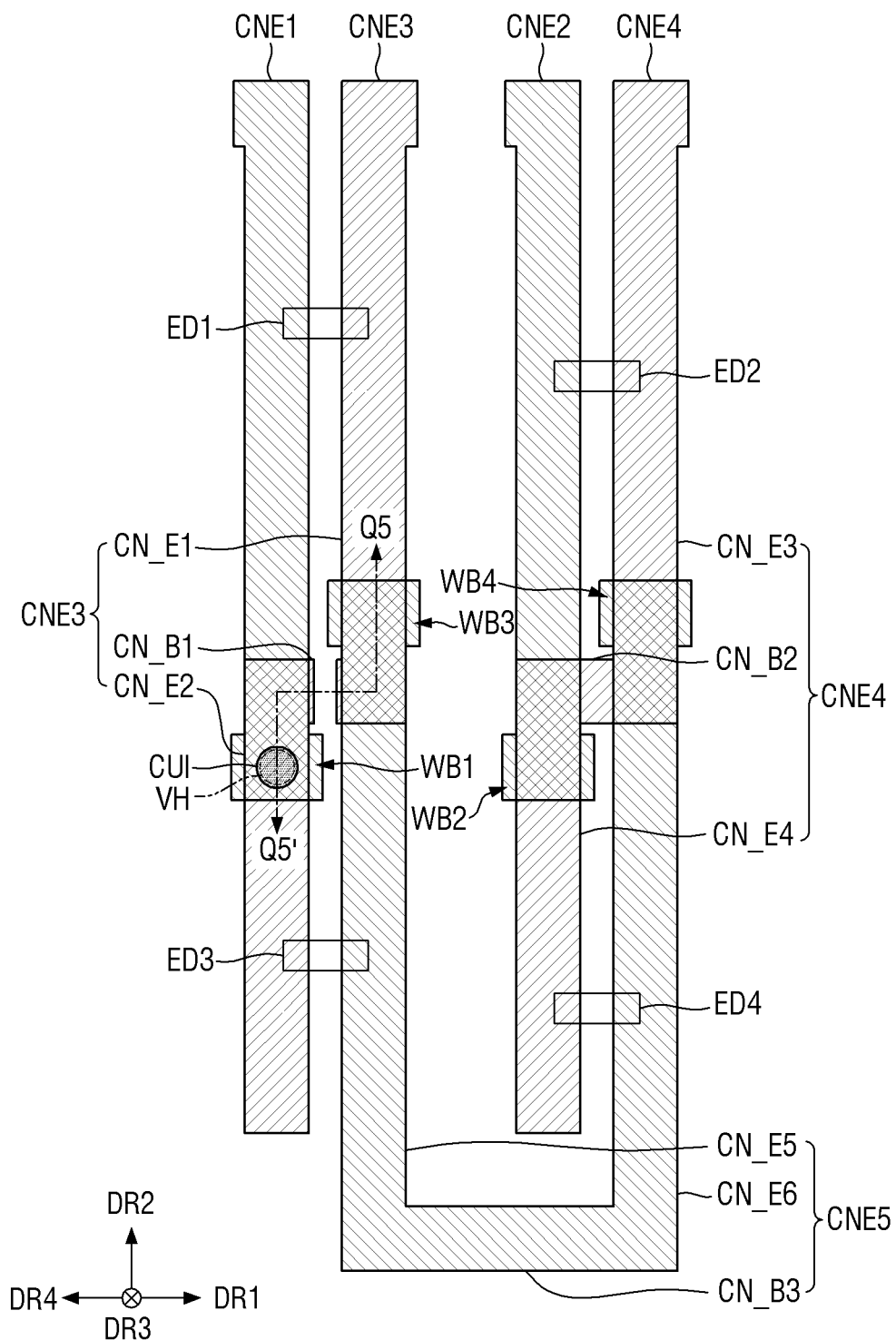
Figure 16:
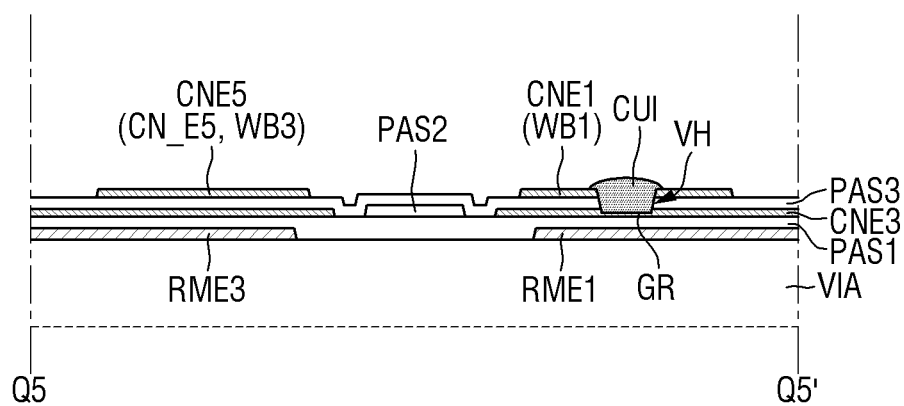

FIGS. 12 to 16 are schematic plan views or schematic cross-sectional views illustrating a repair process for a display device according to an embodiment. FIG. 12 illustrates connecting electrodes CNE and light-emitting elements ED to illustrate a disconnected third connecting electrode CNE3. FIGS. 13 and 14 are schematic cross-sectional views taken along line Q4-Q4' of FIG. 12. FIG. 15 illustrates how a through hole and a conductive member are formed in the array of the connecting electrodes CNE of FIG. 12. FIG. 16 is a schematic cross-sectional view taken along line Q5-Q5' of FIG. 15.

Referring to FIGS. 12 and 13, after the fabrication of connecting electrodes CNE, a lighting inspection is performed on each subpixel SPXn. During the lighting inspection, some subpixels SPXn may be detected as not being able to be properly turned on, i.e., dark spot defects may be detected. A dark spot defect may be caused by a disconnected third or fourth connecting electrode CNE3 or CNE4, particularly, a disconnected first or second connector CN_B1 or CN_B2.

As illustrated in FIGS. 12 and 13, a first connector CN_B1 of a third connecting electrode CNE3 may be electrically disconnected. In this case, a signal may be applied from a first connecting electrode CNE1 through a first light-emitting element ED1, but as the third connecting electrode CNE3 is floated due to the disconnected first connector CN_B1 of the third connecting electrode CNE3, the signal may be disconnected. As a result, failure for light-emitting elements ED in an entire subpixel SPXn to emit light, i.e., a dark-spot defect, may occur.

As illustrated in FIG. 13, the first and third electrodes RME1 and RME3 are disposed on a via layer VIA, and a first insulating layer PAS1 is disposed on the first and third electrodes RME1 and RME3. A second insulating layer PAS2 and the third connecting electrode CNE3 are disposed on the first insulating layer PAS1. The third connecting electrode CNE3, which is supposed to continuously cover (or overlap) the second insulating layer PAS2, may be divided into areas by disconnection thereof. A third insulating layer PAS3 is disposed on the third connecting electrode CNE3 and the second insulating layer PAS2. A fifth extension CN_E5 and a third part WB3 of a fifth connecting electrode CNE5 are disposed in an overlapping area of the fifth connecting electrode CNE5 and the third electrode RME3, on the third insulating layer PAS3, and a first part WB1 of the first connecting electrode CNE1 is disposed in an overlapping area of the fifth connecting electrode CNE5 and the first electrode RME1.

In an embodiment, the first part WB1 of the first connecting electrode CNE1, which overlaps the third connecting electrode CNE3, may be connected to the third connecting electrode CNE3.

Referring to FIG. 14, laser light is applied to the first part WB1 of the first connecting electrode CNE1, which overlaps the third connecting electrode CNE3. As laser light is applied to the first part WB1 of the first connecting electrode CNE1, a through hole VH is formed in the first part WB1 of the first connecting electrode CNE1 and the third insulating layer PAS3. The surface of the third connecting electrode CNE3 is further removed by the laser light so that a groove GR, which is relatively thin, may be formed, but the disclosure is not limited thereto. For example, the groove GR may not be formed on the surface of the third connecting electrode CNE3. A side surface of the first part WB1 of the first connecting electrode CNE1, a side surface of the third insulating layer PAS3, and the top surface of the third connecting electrode CNE3 may be exposed in the through hole VH.

Referring to FIGS. 15 and 16, a conductive member CUI is formed by applying conductive ink to the through hole VH. The conductive ink may be ink including conductive particles. In an embodiment, the conductive ink may be ink including silver (Ag) particles or may include Ag dots. To improve the precision of application of the conductive ink to the through hole VH, the conductive ink may be applied by inkjet printing, but the disclosure is not limited thereto.

The conductive member CUI may fill the through hole VH to protrude from above the through hole VH. The top surface of the conductive member CUI may protrude or may be projected beyond the top surface of the first part WB1 of the first connecting electrode CNE1, but the disclosure is not limited thereto. As another example, the top surface of the conductive member CUI may be colinear with the top surface of the first part WB1 of the first connecting electrode CNE1. The conductive member CUI may directly contact the side surface of the first part WB1 of the first connecting electrode CNE1, the side surface of the third insulating layer PAS3, and the top surface of the third connecting electrode CNE3. As a result, the first and third connecting electrodes CNE1 and CNE3 may be electrically connected via the conductive member CUI.

The through hole VH and the conductive member CUI are disposed in the overlapping area of the first part WB1 of the first connecting electrode CNE1 and the second extension CN_E2 of the third connecting electrode CNE3. A signal applied from the first connecting electrode CNE1 may be transmitted from the first part WB1 of the first connecting electrode CNE1 to the second extension CN_E2 of the third connecting electrode CNE3 through the conductive member CUI. This signal may also be transmitted to a third light-emitting element ED3, which is disposed between the second extension CN_E2 of the third connecting electrode CNE3 and the fifth extension CN_E5 of the fifth connecting electrode CN_E5, so that the third light-emitting element ED3 may emit light. This signal may also be transmitted to second and fourth light-emitting elements ED2 and ED4 through the fifth extension CN_E5 of the fifth connecting electrode CNE5 so that the second and fourth light-emitting elements ED2 and ED4 may also emit light. In contrast, as the first extension CN_E1 of the third connecting electrode CNE3 is floated, the first light-emitting element ED1 does not emit light. As a result of a repair process, all the light-emitting elements ED except for the first light-emitting element ED1 can emit light, and thus, a dark-spot defect can be addressed.

FIGS. 12 to 16 illustrate that in response to disconnection of the first connector CN_B1 of the third connecting electrode CNE3, the third connecting electrode CNE3 is repaired by forming the through hole VH and the conductive member CUI in the overlapping area of the first part WB1 of the first connecting electrode CNE1 and the second extension CN_E2 of the third connecting electrode CNE3. As another example, the third and fifth connecting electrodes CNE3 and CNE5 may be connected by forming a through hole and a conductive member in an overlapping area of the first extension CN_E1 of the third connecting electrode CNE3 and the third part WB3 of the fifth connecting electrode CNE5. The third light-emitting element ED3 may not emit light, but the first, second, and fourth light-emitting elements ED1, ED2, and ED4 may be connected in series and may thus be able to emit light.

Although not specifically illustrated, the second connector CN_B2 of the fourth connecting electrode CNE4 may be electrically disconnected. In this case, the second and fourth connecting electrodes CNE2 and CNE4 may be connected by forming a through hole and a conductive member in an overlapping area of the second part WB2 of the second connecting electrode CNE2 and the fourth extension CN_E4 of the fourth connecting electrode CNE4. The second light-emitting element ED2 may not emit light, but the first, third, and fourth light-emitting elements ED1, ED3, and ED4 may be connected in series and may thus be able to emit light. As another example, the fourth and fifth connecting electrodes CNE4 and CNE5 may be connected by forming a through hole and a conductive member in the overlapping area of the fourth part WB4 of the fifth connecting electrode CNE5 and the third extension CN_E3 of the fourth connecting electrode CNE4. The fourth light-emitting element ED4 may not emit light, but the first, second, and third light-emitting elements ED1, ED2, and ED3 may be connected in series and may thus be able to emit light.

The structure of the connecting electrodes CNE of the display device 10 may vary. Display devices according to other embodiments will hereinafter be described.

Figure 17:
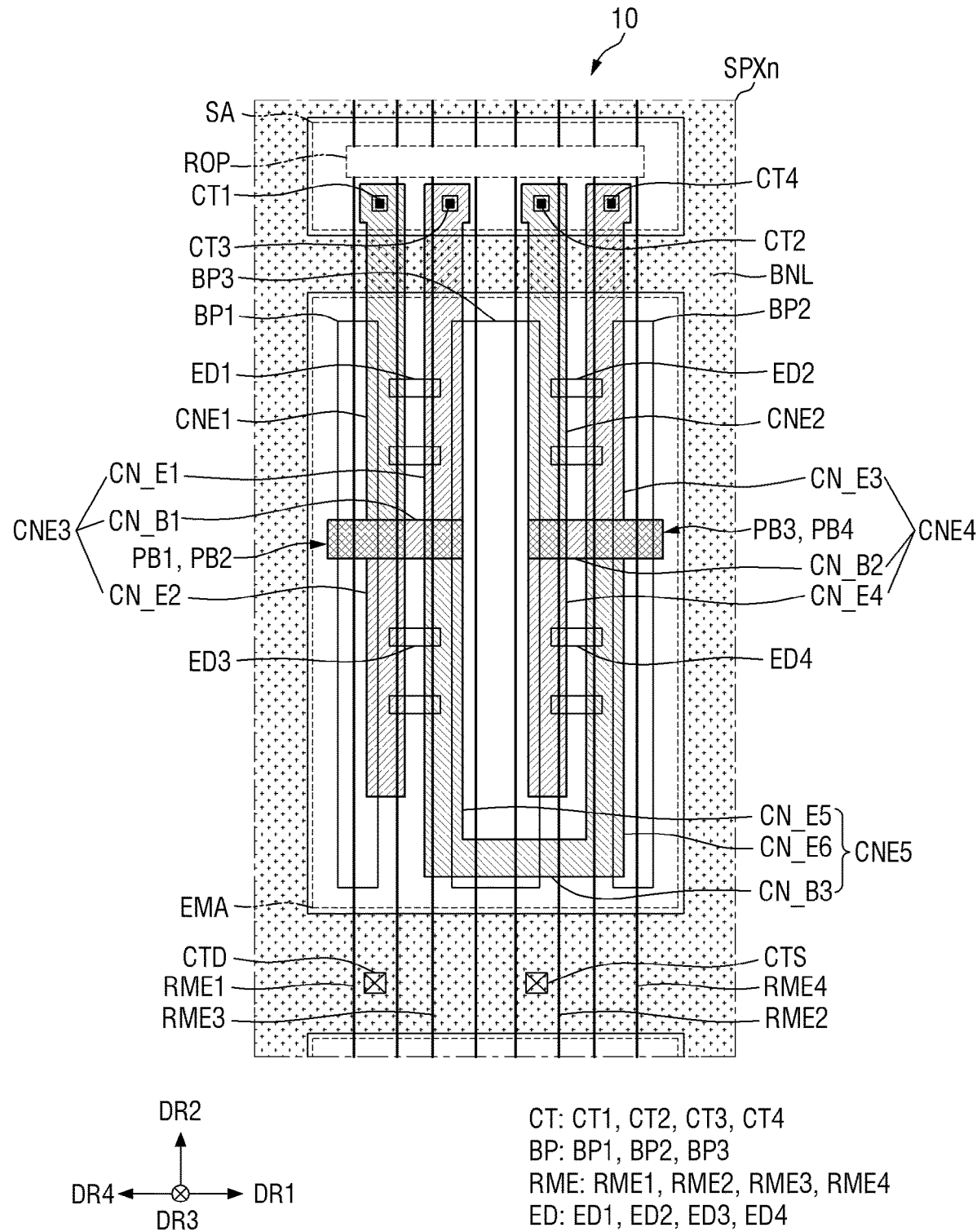
FIG. 17 is a schematic plan view of a subpixel of a display device according to another embodiment of the disclosure.
Figure 18:
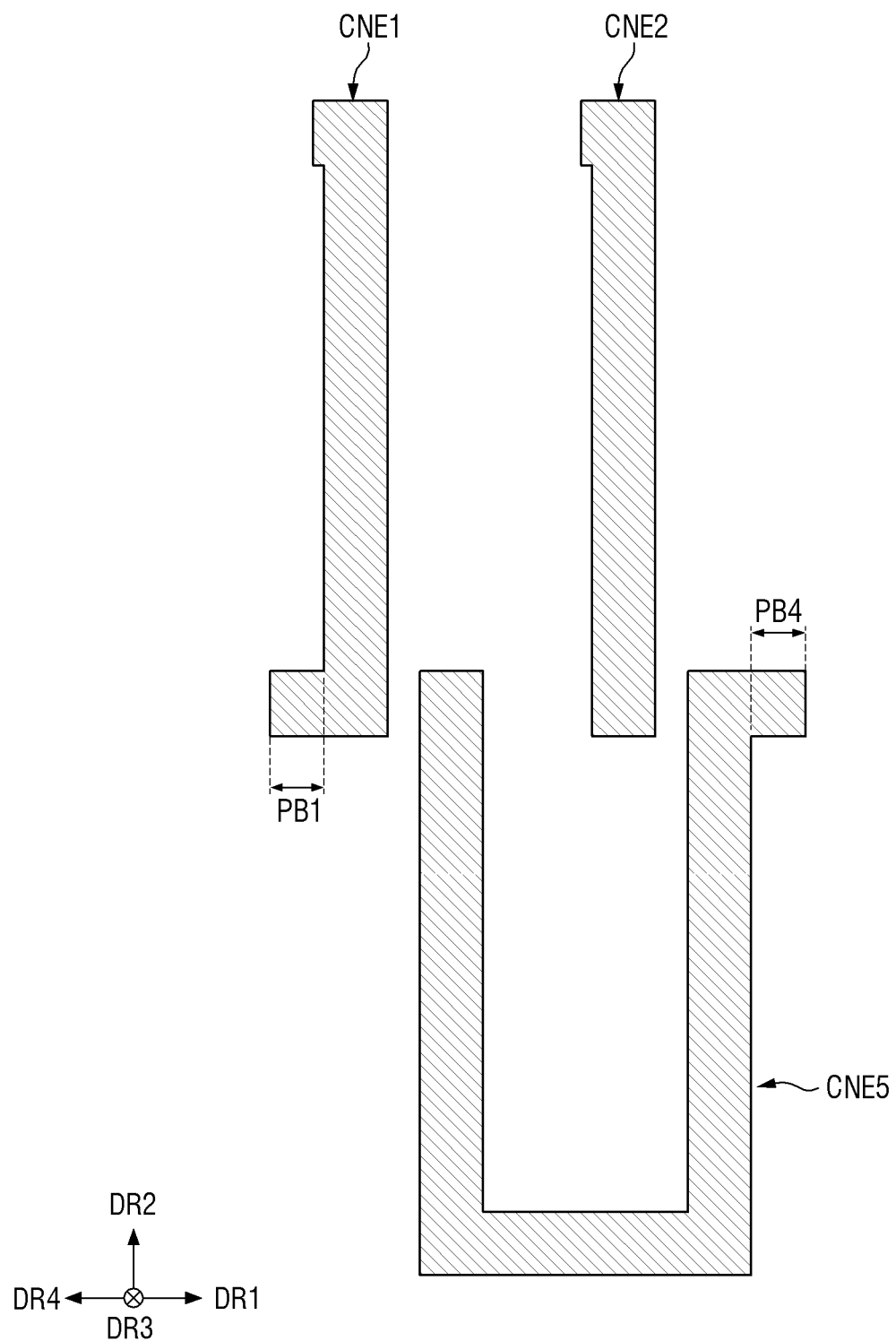
FIG. 18 is a schematic plan view illustrating first, second, and fifth connecting electrodes of FIG. 17.
Figure 19:
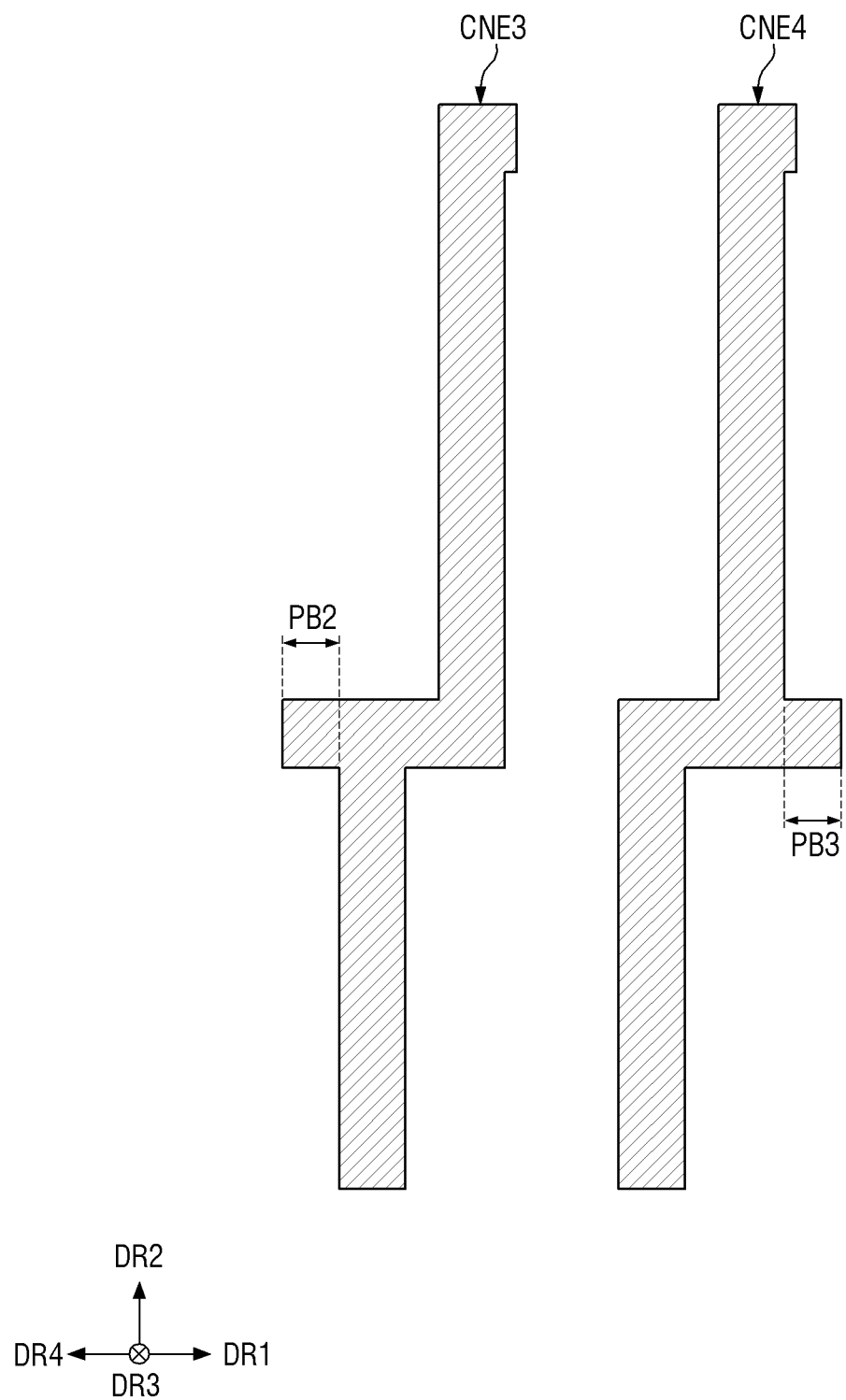
FIG. 19 is a schematic plan view illustrating third and fourth connecting electrodes of FIG. 17.
Figure 20:
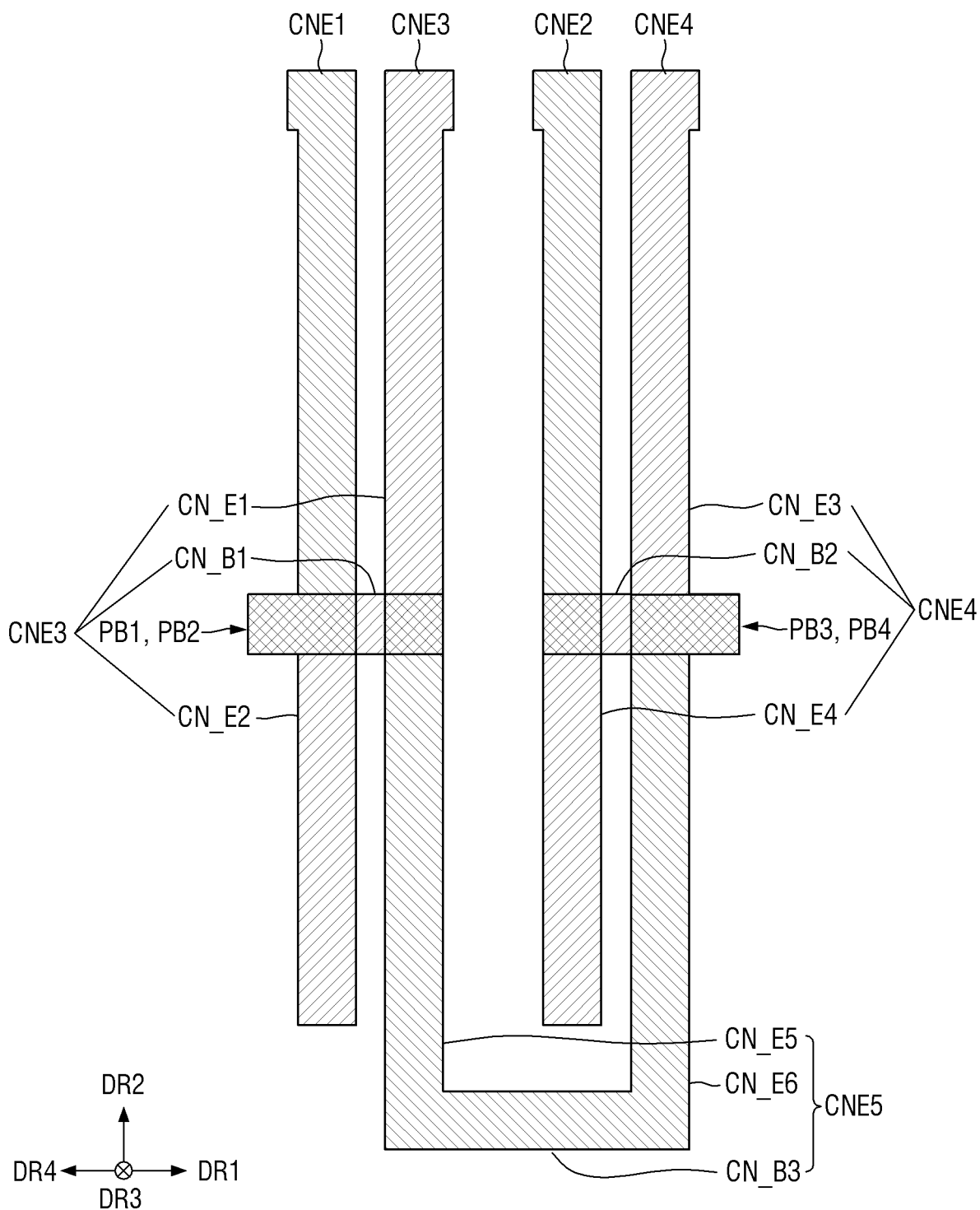
FIG. 20 is a schematic plan view illustrating the layout of the first through fifth connecting electrodes of FIGS. 18 and 19.
Figure 21:
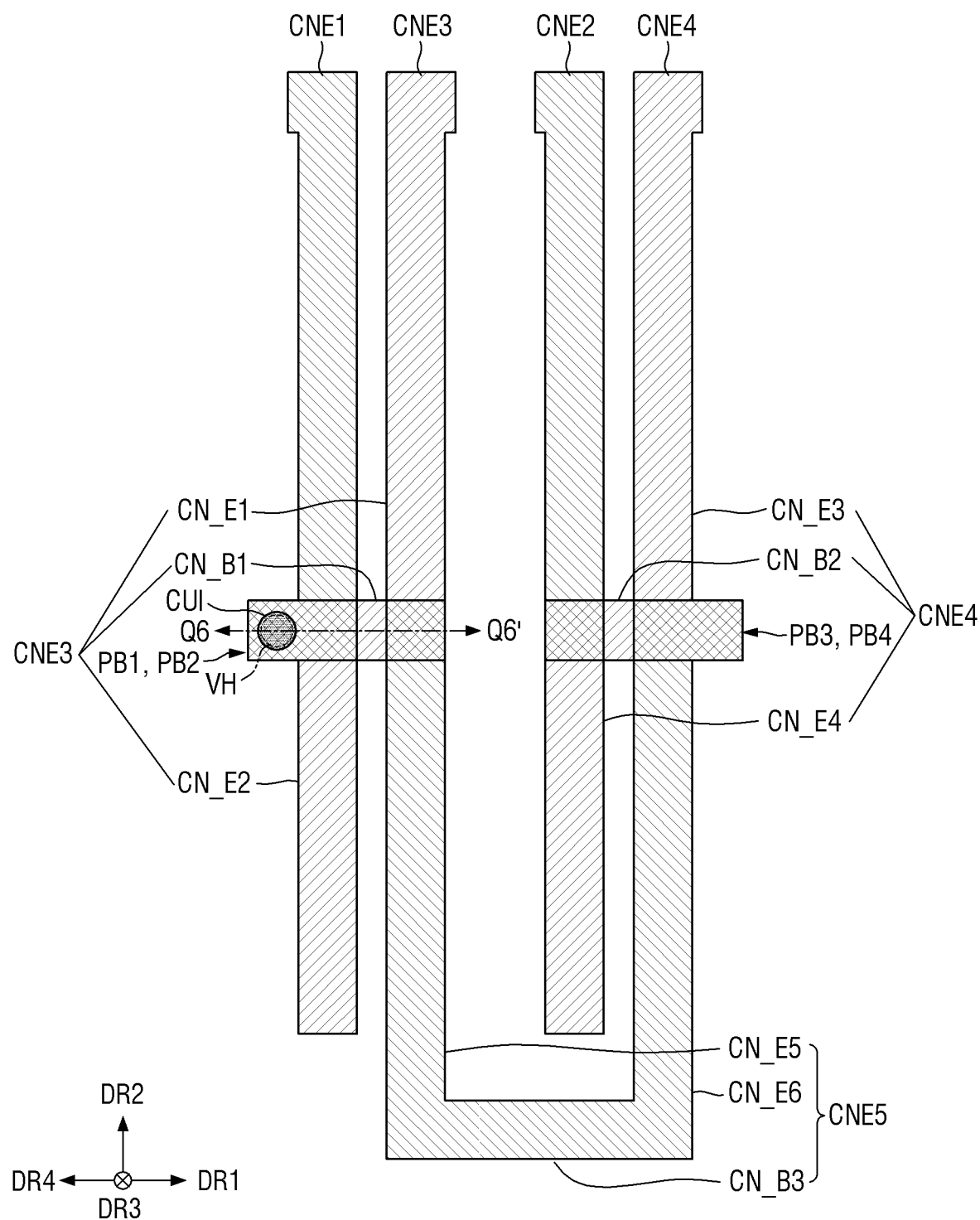
FIG. 21 is a schematic plan view illustrating the layout of the first through fifth connecting electrodes of FIG. 20, through holes, and a conductive member.
Figure 22:
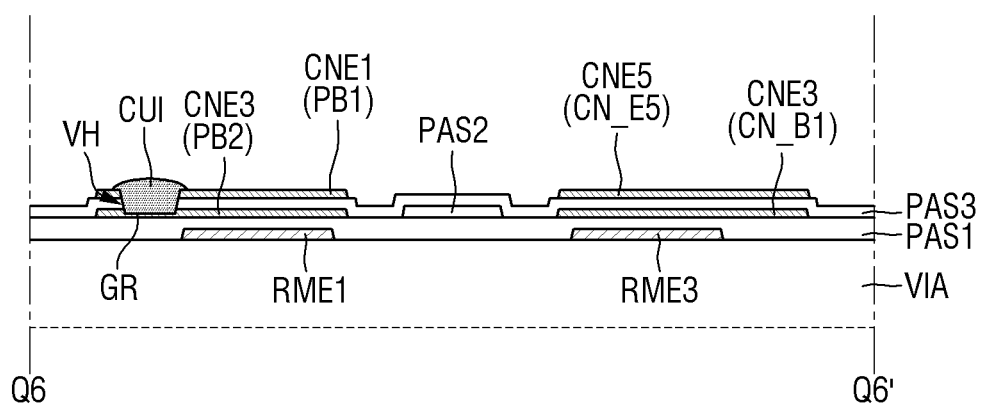
FIG. 22 is a schematic cross-sectional view taken along line Q6-Q6' of FIG. 21.

FIG. 17 is a schematic plan view of a subpixel of a display device according to an embodiment. FIG. 18 is a schematic plan view illustrating first, second, and fifth connecting electrodes of FIG. 17. FIG. 19 is a schematic plan view illustrating third and fourth connecting electrodes of FIG. 17. FIG. 20 is a schematic plan view illustrating the layout of the first to fifth connecting electrodes of FIGS. 18 and 19. FIG. 21 is a schematic plan view illustrating the layout of the first to fifth connecting electrodes of FIG. 20, through holes, and a conductive member. FIG. 22 is a schematic cross-sectional view taken along line Q6-Q6' of FIG. 21.

A display device 10 of FIGS. 17 to 22 differs from the display device 10 of FIGS. 3 to 16 in the structure of connecting electrodes CNE. Thus, the display device 10 of FIGS. 17 to 20 will hereinafter be described, focusing on the differences with the display device 10 of FIGS. 3 to 16.

Referring to FIGS. 17 to 22, a first connecting electrode CNE1 may include a first protrusion PB1, which protrudes in a fourth direction DR4 intersecting the direction in which the first connecting electrode CNE1 extends, for example, a second direction DR2. The first protrusion PB1 may be a portion of the first connecting electrode CNE1 that protrudes from an end of the first connecting electrode CNE1 in an emission area EMA of a subpixel SPXn in the fourth direction DR4. The first protrusion PB1 may overlap a portion of a third connecting electrode CNE3, particularly, a second protrusion PB2, which protrudes from a second extension CN_E2 of the third connecting electrode CNE3 in the fourth direction DR4. A third insulating layer PAS3 may be interposed between the first and third connecting electrodes CNE1 and CNE3 so that the first and third connecting electrodes CNE1 and CNE3 may be spaced apart from each other in a third direction DR3. Another portion of the first connecting electrode CNE1 other than the first protrusion PB1 may overlap a first connector CN_B1 of the third connecting electrode CNE3. The first protrusion PB1 of the first connecting electrode CNE1 may be spaced apart from the first connector CN_B1 of the third connecting electrode CNE3 in the fourth direction DR4 and may thus not overlap the first connector CN_B1 of the third connecting electrode CNE3.

The third connecting electrode CNE3 may include a second protrusion PB2, which protrudes from the first connector CN_B1 in the fourth direction DR4. The second protrusion PB2 may overlap a portion of the first connecting electrode CNE3, particularly, the first protrusion PB1 of the first connecting electrode CNE1. The third insulating layer PAS3 may be interposed between the first and third connecting electrodes CNE1 and CNE3 so that the first and third connecting electrodes CNE1 and CNE3 may be spaced apart from each other in the third direction DR3. The first connector CN_B1 of the third connecting electrode CNE3 may overlap the first connecting electrode CNE1 and a fifth extension CN_E5 of a fifth connecting electrode CNE5. A second extension CN_E2 of the third connecting electrode CNE3 may be spaced apart from the first connecting electrode CNE1 in the second direction DR2 and may thus not overlap the first connecting electrode CNE1.

A fourth connecting electrode CNE4 may include a third protrusion PB3, which protrudes from a second connector CN_B2 in a first direction DR1. The third protrusion PB3 may overlap a portion of the fifth connecting electrode CNE5, particularly, a fourth protrusion PB4 of the fifth connecting electrode CNE5. The third insulating layer PAS3 may be interposed between the fourth and fifth connecting electrodes CNE4 and CNE5 so that the fourth and fifth connecting electrodes CNE4 and CNE5 may be spaced apart from each other in the third direction DR3. The second connector CN_B2 of the fourth connecting electrode CNE4 may overlap the second connecting electrode CNE2 and a sixth extension CN_E6 of the fifth connecting electrode CNE5. A fourth extension CN_E4 of the fourth connecting electrode CNE4 may be spaced apart from the second connecting electrode CNE2 in the second direction DR2 and may thus not overlap the second connecting electrode CNE2.

The fifth connecting electrode CNE5 may include the fourth protrusion PB4, which protrudes from the sixth extension CN_E6 in the first direction DR1. The fourth protrusion PB4 may be a portion of the fifth connecting electrode CNE5 that protrudes from an end of the sixth extension CN_E6 in the emission area EMA of the subpixel SPXn in the first direction DR1. The fourth protrusion PB4 may overlap a portion of the fourth connecting electrode CNE4, particularly, the third protrusion PB3 of the fourth connecting electrode CNE4. The sixth extension CN_E6 of the fifth connecting electrode CNE5 may be spaced apart from the fourth connecting electrode CNE4 in the second direction DR2 and may thus not overlap the fourth connecting electrode CNE4. The third insulating layer PAS3 may be interposed between the fourth and fifth connecting electrodes CNE4 and CNE5 so that the fourth and fifth connecting electrodes CNE4 and CNE5 may be spaced apart from each other in the third direction DR3.

In an embodiment, in case that the first connector CN_B1 of the third connecting electrode CNE3 is electrically disconnected, the third connecting electrode CNE3 may be repaired by connecting the first protrusion PB1 of the first connecting electrode CNE1 and the second protrusion PB2 of the third connecting electrode CNE3, which overlaps the first protrusion PB1 of the first connecting electrode CNE1. As already described above, the first and third connecting electrodes CNE1 and CNE3 may be connected by forming a through hole with the use of laser light and filling the through hole with a conductive member. Specifically, a through hole may be formed by applying laser light into the overlapping area of the first protrusion PB1 of the first connecting electrode CNE1 and the second protrusion PB2 of the third connecting electrode CNE3 and may be filled with conductive ink, thereby connecting the first protrusion PB1 of the first connecting electrode CNE1 and the second protrusion PB2 of the third connecting electrode CNE3. In case that the second connector CN_B2 of the fourth connecting electrode CNE4 is electrically disconnected, the fourth connecting electrode CNE4 may be repaired by connecting the third protrusion PB3 of the fourth connecting electrode CNE4 to the fourth protrusion PB4 of the fifth connecting electrode CNE5, which overlaps the third protrusion PB3 of the first connecting electrode CNE4.

Referring to FIGS. 21 and 22, in case that the first connector CN_B1 of the third connecting electrode CNE3 is electrically disconnected, the third connecting electrode CNE3 may be repaired by connecting the first protrusion PB1 of the first connecting electrode CNE1 and the second protrusion PB2 of the third connecting electrode CNE3, which overlaps the first protrusion PB1 of the first connecting electrode CNE1.

A through hole VH is formed by applying laser light to the first protrusion PB1 of the first connecting electrode CNE1, which overlaps the second protrusion PB2 of the third connecting electrode CNE3, and a conductive member CUI is formed by applying conductive ink over the through hole VH. The surface of the second protrusion PB2 of the third connecting electrode CNE3 is further removed by the laser light so that a groove GR, which is relatively thin, may be formed. A side surface of the first protrusion PB1 of the first connecting electrode CNE1, a side surface of the third insulating layer PASS, and the top surface of the second protrusion PB2 of the third connecting electrode CNE3 are exposed in the through hole VH.

The conductive member CUI may fill the through hole VH to protrude from above the through hole VH. The top surface of the conductive member CUI may be projected beyond the top surface of the first protrusion PB1 of the first connecting electrode CNE1, but the disclosure is not limited thereto. As another example, the top surface of the conductive member CUI may be colinear with the first protrusion PB1 of the first connecting electrode CNE1. The conductive member CUI may directly contact the side surface of the first protrusion PB1 of the first connecting electrode CNE1, the side surface of the third insulating layer PAS3, and the top surface of the second protrusion PB2 of the third connecting electrode CNE3. As a result, the first and third connecting electrodes CNE1 and CNE3 may be electrically connected via the conductive member CUI.

A signal applied from the first connecting electrode CNE1 may be transmitted from the first protrusion PB1 of the first connecting electrode CNE1 to the second protrusion PB2 of the third connecting electrode CNE3 through the conductive member CUI. This signal may also be transmitted to a third light-emitting element ED3, which is disposed between the second extension CN_E2 of the third connecting electrode CNE3 and the fifth extension CN_E5 of the fifth connecting electrode CNE5, so that the third light-emitting element ED3 may emit light. This signal may also be transmitted to second and fourth light-emitting elements ED2 and ED4 through the fifth extension CN_E5 of the fifth connecting electrode CNE5 so that the second and fourth light-emitting elements ED2 and ED4 may also emit light. In contrast, as the first extension CN_E1 of the third connecting electrode CNE3 is floated, a first light-emitting element ED1 does not emit light. As a result of a repair process, all light-emitting elements ED except for the first light-emitting element ED1 can be allowed to emit light, and thus, a dark-spot defect can be addressed.

Although not specifically illustrated, the second connector CN_B2 of the fourth connecting electrode CNE4 may be electrically disconnected. In this case, the fourth and fifth connecting electrodes CNE4 and CNE5 may be connected by forming a through hole and a conductive member in the overlapping area of the third protrusion PB3 of the fourth connecting electrode CNE4 and the fourth protrusion PB4 of the fifth connecting electrode CNE5. The fourth light-emitting element ED4 may not emit light, but the first, second, and third light-emitting elements ED1, ED2, and ED3 may be connected in series and may thus be able to emit light.

As described above, as connecting electrodes are disposed to overlap each other at least in part, any disconnected connecting electrode can be repaired by forming a through hole and a conductive member in the overlapping area of the connecting electrodes. Also, a dark-spot defect that may be caused by any disconnected connecting electrode can be repaired, and as a result, productivity can be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   electrodes disposed on a substrate, the electrodes extending in a first direction and spaced apart from each other;
   a first insulating layer disposed on the electrodes;
   light-emitting elements disposed on the first insulating layer between the electrodes;
   a second insulating layer disposed on the light-emitting elements, the second insulating layer extending in the first direction;
   connecting electrodes disposed on the second insulating layer and the light-emitting elements, the connecting electrodes electrically contacting end portions of each of the light-emitting elements; and
   a third insulating layer disposed between the connecting electrodes, wherein
   an end portion of at least one of the connecting electrodes overlaps another one of the connecting electrodes,
   at least one of the connecting electrodes includes a first part that is disposed at an end of the at least one of the connecting electrodes and has a width larger than widths of other parts of the at least one of the connecting electrodes in a second direction intersecting the first direction, and
   the first part overlaps another connecting electrode.

2. The display device of claim 1, wherein the electrodes include:
   a first electrode;
   a second electrode;
   a third electrode that is disposed between a side of the first electrode and a side of the second electrode; and
   a fourth electrode that faces another side of the second electrode.

3. The display device of claim 2, wherein the connecting electrodes include:
   a first connecting electrode that overlaps the first electrode;
   a second connecting electrode that overlaps the second electrode;
   a third connecting electrode that extends to overlap the third electrode and is bent in part to overlap the first electrode;
   a fourth connecting electrode that extends to overlap the fourth electrode and is bent in part to overlap the second electrode; and
   a fifth connecting electrode that extends to overlap the third electrode and is bent in part to overlap the fourth electrode.

4. The display device of claim 3, wherein
   the third connecting electrode includes:
      a first extension that overlaps the third electrode;
      a second extension that overlaps the first electrode; and
      a first connector that electrically connects the first and second extensions,
   the fourth connecting electrode includes:
      a third extension that overlaps the fourth electrode;
      a fourth extension that overlaps the second electrode; and
      a second connector that electrically connects the third and fourth extensions, and
   the fifth connecting electrode includes:
      a fifth extension that overlaps the third electrode;
      a sixth extension that overlaps the fourth electrode; and
      a third connector that electrically connects the fifth and sixth extensions.

5. The display device of claim 4, wherein
   the first connecting electrode includes a first part that is disposed at an end of the first connecting electrode and has a width larger than widths of other parts of the first connecting electrode in a second direction intersecting the first direction, and
   the first part overlaps the second extension of the third connecting electrode.

6. The display device of claim 4, wherein
   the second connecting electrode includes a second part that is disposed at an end of the second connecting electrode and has a width larger than widths of other parts of the second connecting electrode in a second direction intersecting the first direction, and
   the second part overlaps the fourth extension of the fourth connecting electrode.

7. The display device of claim 4, wherein
   the fifth connecting electrode includes:
      a third part that is disposed at an end of the fifth extension and has a width larger than other parts of the fifth extension in a second direction intersecting the first direction; and
      a fourth part that is disposed at an end of the sixth extension and has a width larger than other parts of the sixth extension in the second direction,
   the third part overlaps the first extension of the third connecting electrode, and
   the fourth part overlaps the third extension of the fourth connecting electrode.

8. The display device of claim 5, further comprising:
   a through hole penetrating the first part and the third insulating layer to expose the second extension of the third connecting electrode; and
   a conductive member electrically contacting the first part, the third insulating layer, and the second extension of the third connecting electrode.

9. The display device of claim 4, wherein the light-emitting elements include:
   a first light-emitting element that is disposed between the first connecting electrode and the first extension of the third connecting electrode;
   a second light-emitting element that is disposed between the second connecting electrode and the third extension of the fourth connecting electrode;
   a third light-emitting element that is disposed between the second extension of the third connecting electrode and the fifth extension of the fifth connecting electrode; and
   a fourth light-emitting element that is disposed between the fourth extension of the fourth connecting electrode and the sixth extension of the fifth connecting electrode.

10. A display device comprising:
   electrodes disposed on a substrate, the electrodes extending in a first direction and spaced apart from each other;
   a first insulating layer disposed on the electrodes;
   light-emitting elements disposed on the first insulating layer between the electrodes;
   a second insulating layer disposed on the light-emitting elements, the second insulating layer extending in the first direction;
   connecting electrodes disposed on the second insulating layer and the light-emitting elements, the connecting electrodes electrically contacting end portions of each of the light-emitting elements;
   a third insulating layer disposed between the connecting electrodes;
   a through hole penetrating one of the connecting electrodes and the third insulating layer; and a conductive member disposed to fill the through hole, wherein an end portion of at least one of the connecting electrodes overlaps another one of the connecting electrodes, the through hole penetrates the end portion of the at least one of the connecting electrodes to expose the connecting electrode overlapping the end portion of the at least one of the connecting electrodes, the conductive member electrically contacting the end portion of the at least one of the connecting electrodes, the third insulating layer, and the connecting electrode overlapping the end portion of the at least one of the connecting electrodes, through the through hole, and the end portion of the at least one of the connecting electrodes has a width larger than widths of other parts of the at least one of the connecting electrodes in a second direction intersecting the first direction.

11. The display device of claim 10, wherein
the electrodes include:
  a first electrode;
  a second electrode;
  a third electrode that is disposed between a side of the first electrode and a side of the second electrode; and
  a fourth electrode that faces another side of the second electrode, and
the connecting electrodes include:
  a first connecting electrode that overlaps the first electrode;
  a second connecting electrode that overlaps the second electrode;
  a third connecting electrode that extends to overlap the third electrode and is bent in part to overlap the first electrode;
  a fourth connecting electrode that extends to overlap the fourth electrode and is bent in part to overlap the second electrode; and
  a fifth connecting electrode that extends to overlap the third electrode and is bent in part to overlap the fourth electrode.

12. The display device of claim 11, wherein
the third connecting electrode includes:
  a first extension that overlaps the third electrode;
  a second extension that overlaps the first electrode; and
  a first connector that electrically connects the first and second extensions,
the fourth connecting electrode includes:
  a third extension that overlaps the fourth electrode;
  a fourth extension that overlaps the second electrode; and
  a second connector that electrically connects the third and fourth extensions, and
the fifth connecting electrode includes:
  a fifth extension that overlaps the third electrode;
  a sixth extension that overlaps the fourth electrode; and
  a third connector that electrically connects the fifth and sixth extensions.

13. The display device of claim 12, wherein
the first connecting electrode includes a first part that is disposed at an end of the first connecting electrode and has a width larger than widths of other parts of the first connecting electrode in a second direction intersecting the first direction, and
the first part overlaps the second extension of the third connecting electrode.

14. The display device of claim 12, wherein
the second connecting electrode includes a second part that is disposed at an end of the second connecting electrode and has a width larger than widths of other parts of the second connecting electrode in a second direction intersecting the first direction,
the second part overlaps the fourth extension of the fourth connecting electrode,
the fifth connecting electrode includes:
  a third part that is disposed at an end of the fifth extension and has a width larger than widths of other parts of the fifth extension in the second direction; and
  a fourth part that is disposed at an end of the sixth extension and has a width larger than widths of other parts of the sixth extension in the second direction,
the third part overlaps the first extension of the third connecting electrode, and the fourth part overlaps the third extension of the fourth connecting electrode.

15. The display device of claim 13, wherein
the through hole penetrates the first part and the third insulating layer to expose the second extension of the third connecting electrode, and
the conductive member electrically contacts the first part, the third insulating layer, and the second extension of the third connecting electrode.

16. A display device comprising:
electrodes disposed on a substrate, the electrodes extending in a first direction and spaced apart from each other;
a first insulating layer disposed on the electrodes;
light-emitting elements disposed on the first insulating layer between the electrodes;
a second insulating layer disposed on the light-emitting elements, the second insulating layer extending in the first direction;
connecting electrodes disposed on the second insulating layer and the light-emitting elements, the connecting electrodes electrically contacting end portions of each of the light-emitting elements; and
a third insulating layer disposed between the connecting electrodes, wherein
each of at least two of the connecting electrodes includes a protrusion that protrudes in a second direction intersecting the first direction, and
one of protrusions of the at least two of the connecting electrodes overlaps another one of the protrusions of the at least two of the connecting electrodes, and
the one of the protrusions of the at least two of the connecting electrodes is of a connecting electrode end portion.

17. The display device of claim 16, wherein
the electrodes include:
  a first electrode;
  a second electrode;
  a third electrode that is disposed between a side of the first electrode and a side of the second electrode; and
  a fourth electrode that faces another side of the second electrode, and
the connecting electrodes include:
  a first connecting electrode that overlaps the first electrode;
  a second connecting electrode that overlaps the second electrode;
  a third connecting electrode that extends to overlap the third electrode and is bent in part to overlap the first electrode;

a fourth connecting electrode that extends to overlap the fourth electrode and is bent in part to overlap the second electrode; and a fifth connecting electrode that extends to overlap the third electrode and is bent in part to overlap the fourth electrode.

18. The display device of claim 17, wherein the third connecting electrode includes:

a first extension that overlaps the third electrode;

a second extension that overlaps the first electrode; and a first connector that electrically connects the first and second extensions, the fourth connecting electrode includes:

a third extension that overlaps the fourth electrode;

a fourth extension that overlaps the second electrode; and a second connector that electrically connects the third and fourth extensions, and the fifth connecting electrode includes:

a fifth extension that overlaps the third electrode;

a sixth extension that overlaps the fourth electrode; and a third connector that electrically connects the fifth and sixth extensions.

19. The display device of claim 18, wherein the first connecting electrode includes a first protrusion that protrudes from an end of the first connecting electrode in the second direction, the third connecting electrode includes a second protrusion that protrudes from the first connector in the second direction, and the first and second protrusions overlap each other.

20. The display device of claim 19, further comprising:

a through hole penetrating the first protrusion and the third insulating layer to expose the second protrusion; and a conductive member electrically contacting the first protrusion, the third insulating layer, and the second protrusion through the through hole.

* * * * *